United States Patent
Kanasugi et al.

(10) Patent No.: US 7,573,779 B2
(45) Date of Patent: Aug. 11, 2009

(54) SEMICONDUCTOR MEMORY AND ELECTRONIC DEVICE

(75) Inventors: Masami Kanasugi, Kawasaki (JP);
Koichi Kuroiwa, Kawasaki (JP);
Makoto Muranushi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 59 days.

(21) Appl. No.: 12/000,051

(22) Filed: Dec. 7, 2007

(65) Prior Publication Data

US 2008/0130393 A1    Jun. 5, 2008

Related U.S. Application Data

(63) Continuation of application No. PCT/JP2005/010475, filed on Jun. 8, 2005.

(51) Int. Cl.
*G11C 8/00* (2006.01)
(52) U.S. Cl. .................. 365/239; 365/221; 365/226; 365/230.03
(58) Field of Classification Search ................ 365/239, 365/221, 226, 230.03
See application file for complete search history.

(56) References Cited

U.S. PATENT DOCUMENTS 5,029,141 A    7/1991  Yoshimoto et al.
5,117,395 A    5/1992  Hashimoto
6,700,830 B2 *  3/2004  Wada .................. 365/226
7,272,042 B2 *  9/2007  Nakai ................ 365/185.17

FOREIGN PATENT DOCUMENTS

| JP | 64-076318 | 3/1989 |
| JP | 02-040193 | 2/1990 |
| JP | 05-174570 | 7/1993 |
| JP | 06-282362 | 10/1994 |
| JP | 08-287673 | 11/1996 |
| JP | 11-297071 | 10/1999 |
| JP | 2000-011636 | 1/2000 |
| JP | 2003-068079 | 3/2003 |

\* cited by examiner

*Primary Examiner*—Pho M. Luu
(74) *Attorney, Agent, or Firm*—Arent Fox LLP

(57) ABSTRACT

A semiconductor memory that reduces the power consumption of a memory cell array without exercising control by a microprocessor. The semiconductor memory comprises a memory cell array, a switch for turning on/off power corresponding to row addresses of the memory cell array, an address control section for exercising sequence control on the basis of a write pointer (WP) generated at the time of a write signal being inputted for designating a row address to which data of a predetermined data stream is to be written and a read pointer (RP) generated at the time of a read signal being inputted for designating a row address from which the data is to be read out, and a switch signal output section for generating switch signals for controlling the switch on the basis of the WP and the RP.

16 Claims, 22 Drawing Sheets

SEMICONDUCTOR MEMORY AND ELECTRONIC DEVICE

This application is a continuing application, filed under 35 U.S.C. §111(a), of International Application PCT/JP2005/010475, filed on Jun. 8, 2005.

BACKGROUND

1. FIELD

The embodiments discussed herein are directed to a semiconductor memory and an electronic device and, more particularly, to a semiconductor memory and electronic device for exercising sequence control.

2. DESCRIPTION Of The RELATED ART

A reduction in the power consumption of portable devices, such as portable telephones, is required for the purpose of increasing the length of use time, wait time, or the like.

In recent years the capacity of memory cell arrays included especially in portable devices has increased rapidly. In addition, increases in gate leakage currents and channel leakage currents have taken place because of the miniaturization of large-scale integration (LSI). These leakage currents are not negligible. This contributes to an increase in power consumption. Power consumption tends to increase further in future.

The following measure is proposed as a method for solving this problem. When there is no need to hold information in a memory cell array, power is turned off. For example, power is turned off at power save time, such as intermittent receiving time or nonuse time. When it is necessary to hold the information in the memory cell array, power down is performed by, for example, decreasing voltage (see, for example, Japanese Patent Laid-Open Publication No. Hei11-297071).

However, if a microprocessor is used for controlling the above power down, complex control must be exercised because of, for example, a delay which occurs at the time of turned on/off a switch. This greatly impedes a reduction in power consumption.

SUMMARY

It is an aspect of the embodiments discussed herein to provide a semiconductor memory for exercising sequence control, the memory including a memory cell array, a plurality of power on/off sections for turning on/off power corresponding to addresses of the memory cell array, an address control section exercising sequence control over the memory cell array on the basis of a write pointer generated at the time of a write signal being inputted for designating an address to which data of a predetermined data stream is to be written and a read pointer generated at the time of a read signal being inputted for designating an address from which the data is to be read out and an on/off signal generation section generating on/off signals for controlling power on/off sections on the basis of the write pointer and the read pointer.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Embodiments will now be described in detail with reference to the drawings.

Figure 1:
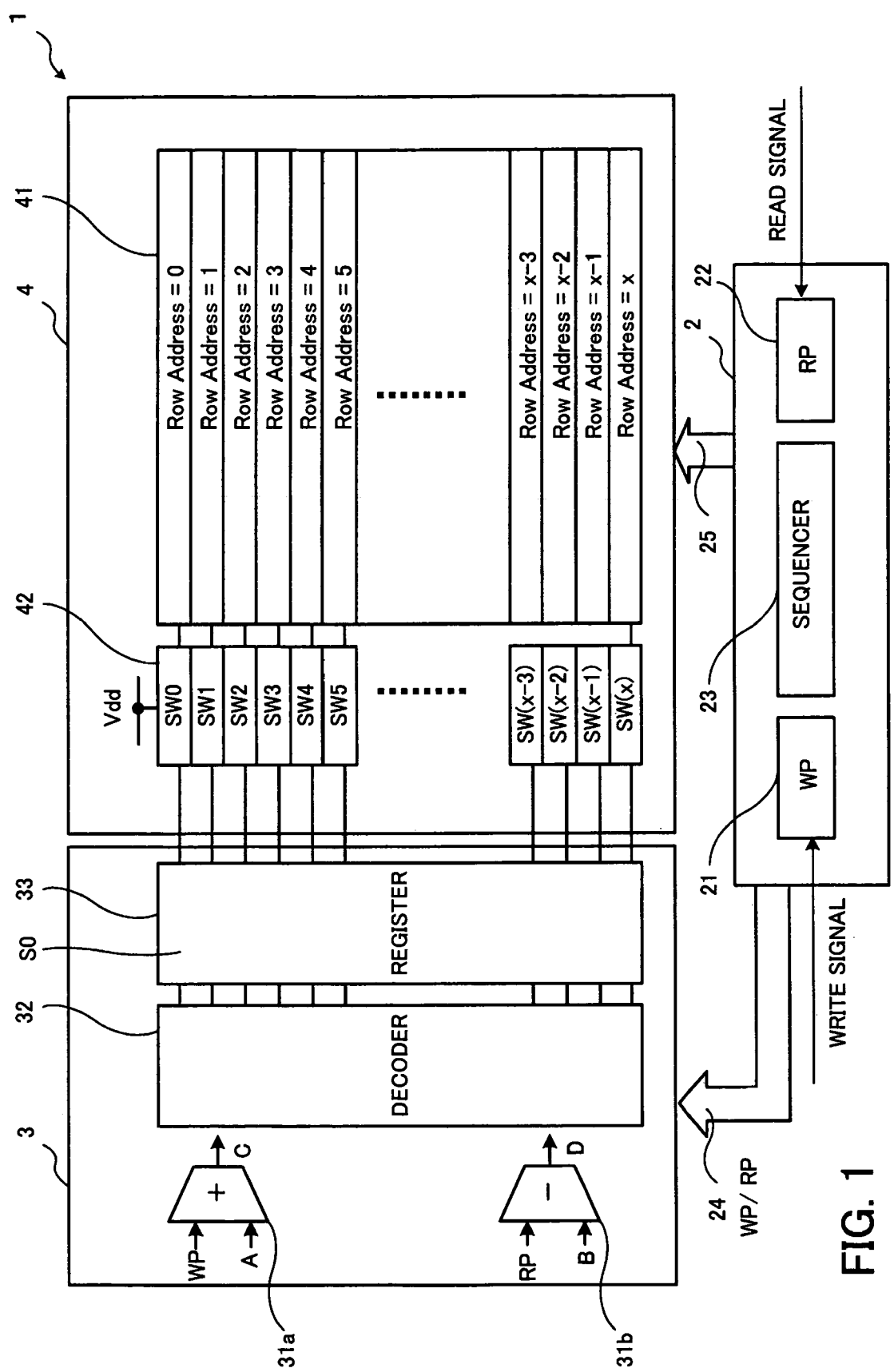
FIG. 1 is a block diagram showing a semiconductor memory according to a first embodiment.

FIG. 1 is a block diagram showing a semiconductor memory according to a first embodiment.

A semiconductor memory 1 shown in FIG. 1 comprises an address control section 2, a switch signal output section 3, and a memory proper 4 having a plurality of row addresses.

The address control section 2 includes a write pointer (WP) generation unit 21 for generating a WP for designating a row address of the memory proper 4 at which data is to be written (at which write access is to be performed), a read pointer (RP) generation unit 22 for generating an RP for designating a row address of the memory proper 4 at which data is to be readout (at which read access is to be performed), and a sequencer 23 for exercising first-in first-out (FIFO) control (serial write-read control).

The address control section 2 and the switch signal output section 3 are connected by an address bus 24 via which the address control section 2 outputs the WP and the RP to the switch signal output section 3. The address control section 2 and the memory proper 4 are connected by an address bus 25 via which the address control section 2 outputs the WP and the RP to the memory proper 4.

The sequencer 23 exercises FIFO control. That is to say, the sequencer 23 gives the memory proper 4 instructions to serially write data and to read out the data in the order in which the data was written. To be concrete, the sequencer 23 outputs an address signal for designating a data write start address, a data read start address, a data write end address, and a data read end address, the WP, and the RP to the memory proper 4.

The switch signal output section 3 includes operation units 31a and 31b, a decoder 32, and a register 33.

The operation unit 31a calculates an address signal C which indicates a row address that comes an address offset value A (A is an integer greater than or equal to 0) after the row address designated by the WP and outputs the address signal C.

The operation unit 31b calculates an address signal D which indicates a row address that comes an address offset value B (B is an integer greater than or equal to 0) before the row address designated by the RP and outputs the address signal D.

Hereinafter the address offset value A may simply be referred to as the "offset value A" (this is the same with the address offset value B).

The offset values A and B are arbitrarily determined on the basis of, for example, rise time and fall time taken at the time of switches SW(0), SW(1), . . . , SW(x−1) and SW(x) described later being turned on/off.

The decoder 32 decodes the address signals C and D sent from the operation units 31a and 31b respectively and generates switch signals P(0) through P(x) for turning on/off the switches SW(0), SW(1), . . . , SW(x−1) and SW(x) at corresponding row addresses. The switch signals P(0) through P(x) are inputted to the register 33 and their logic is held.

The operation units 31a and 31b and the decoder 32 make up an on/off signal generation section included in the semiconductor memory according to the first embodiment.

The memory proper 4 includes a memory cell array 41 and a switch 42.

The memory cell array 41 is made up of (x+1) rows (x is an integer greater than or equal to 1) each of which includes a plurality of memory cells and which have the row addresses 0, 1, . . . , (x−1), and (x) respectively.

Write addresses of the memory cell array 41 start from the row address 0 and the row address 1, the row address 2, the row address 3, etc. follow the row address 0 in that order. Similarly, read addresses of the memory cell array 41 start from the row address 0 and the row address 1, the row address 2, the row address 3, etc. follow the row address 0 in that order.

When data is written to the memory cell array 41, the data is written to the row address 0, the row address 1, the row address 2, the row address 3, etc. in that order from a data bus (not shown). The data written is read out in the order in which the data was written from the data bus (not shown).

The switch 42 is connected to word line driver power supply lines and cell power supply lines corresponding to the row addresses of the memory cell array 41 and includes the switches SW(0), SW(1), . . . , SW(x−1) and SW(x) for turning on/off power. For example, when the switch SW(0) is turned on, the row address 0 goes into a writable or readable state.

The operation of the semiconductor memory according to the first embodiment will now be described.

First, the address control section 2 outputs the value of a WP (WP=0 in this embodiment) which is accessed first to the switch signal output section 3 as an operation start signal.

The switch signal output section 3 reads the value of the WP and outputs a switch signal for turning on a switch SW corresponding to the WP in advance.

In this embodiment, the switch SW(0) is turned on and all of the other switches SW(1), . . . , SW(x−1) and SW(x) are turned off. It is assumed that this is an initial state.

When a write signal and a read signal are inputted to the address control section 2, the WP generation unit 21 generates a WP from the write signal inputted and outputs the WP to the switch signal output section 3 and the memory proper 4. The RP generation unit 22 generates an RP from the read signal inputted and outputs the RP to the switch signal output section 3 and the memory proper 4. In addition, the sequencer 23 outputs the address signal for designating the write start address and the read start address to the memory proper 4 via the address bus 24.

The operation unit 31a then generates the address signal C from the WP outputted from the address control section 2 and the offset value A and outputs the address signal C.

In addition, the operation unit 31b generates the address signal D from the RP outputted from the address control section 2 and the offset value B and outputs the address signal D.

The decoder 32 then decodes the address signals C and D, generates the switch signals P(0) through P(x), are outputs the switch signals P(0) through P(x) to the register 33.

The switch 42 then refers to the switch signals P(0) through P(x) inputted to the register 33 and turns on/off corresponding switches SW.

After the write signal and the read signal are inputted to the address control section 2, the sequencer 23 outputs the address signal for designating the write end address and the read end address to the memory proper 4 via the address bus 24.

An example of the operation of the semiconductor memory 1 according to the first embodiment will now be described.

Figure 2:
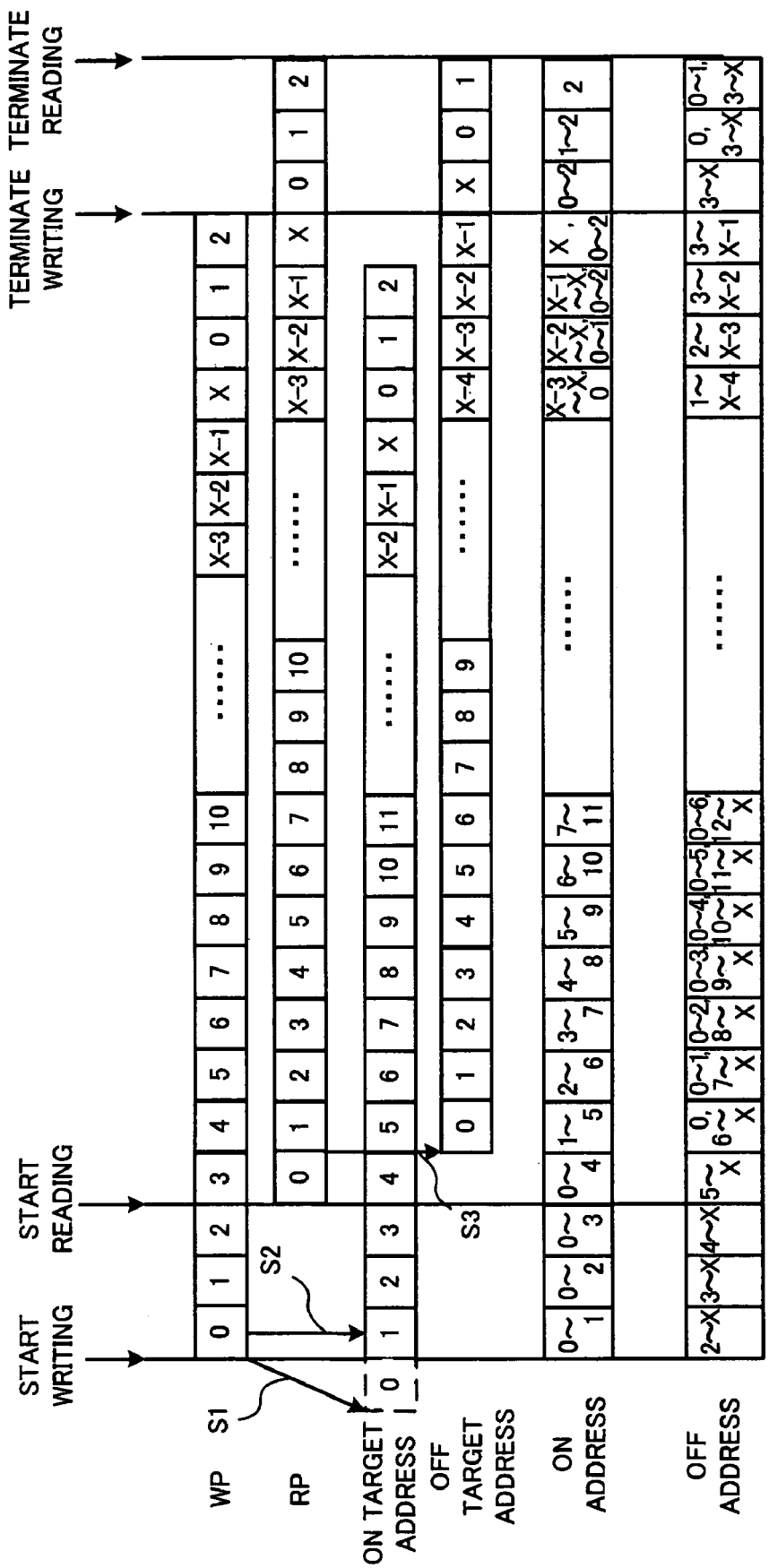
FIG. 2 is a timing chart showing an example of the operation of the semiconductor memory according to the first embodiment.

FIG. 2 is a timing chart showing an example of the operation of the semiconductor memory according to the first embodiment.

A process performed in the case where the offset value A=1 and the offset value B=1 will now be described (this is the same with second, third, and fifth through tenth embodiments).

An "on target address" means a row address which becomes writable or readable at the time of a switch SW being turned on. An "off target address" means a row address which becomes unwritable or unreadable at the time of a switch SW being turned off. An "on address" means a row address which is connected to a switch SW turned on and which is writable or readable. An "off address" means a row address which is connected to a switch SW turned off and which is unwritable or unreadable. For example, at the time when writing is begun, the row addresses 0 and 1 are on addresses and the row addresses 2 through (x) are off addresses.

The switch SW(0) is turned on first prior to writing operation (step S1). When the writing operation is begun, a switch SW corresponding to a row address that comes one, which is an address offset value, after a row address designated by a WP is turned on. That is to say, when WP=0, the switch SW(1) is turned on (step S2).

After that, the WP is incremented by the writing operation. As a result, a switch SW corresponding to a row address that comes one, which is an address offset value, after a row address designated by the WP is turned on. Switches SW are turned on in order in this way.

On the other hand, when reading operation is begun, a switch SW corresponding to a row address that comes one, which is an address offset value, before a row address designated by an RP is turned off. That is to say, when RP=1, the switch SW(0) is turned off (step S3).

After that, the RP is incremented by the reading operation. As a result, a switch SW corresponding to a row address that comes one, which is an address offset value, before a row address designated by the RP is turned off. The switches SW are turned off in order in this way.

After RP=2 is inputted, the reading operation terminates. At this time the decoder 32 terminates the operation of generating a switch signal.

With the semiconductor memory 1 according to the first embodiment in which serial access is performed, that is to say, in which the FIFO control is exercised, an address at which writing operation or reading operation is performed can be determined by a write pointer or a read pointer. There is no need to input a complex address from the outside by a microprocessor or the like. Power is applied only to a switch SW for word line driver power supply lines and cell power supply lines corresponding to a row address to which data is written or from which data is read out. Power is not applied to the other switches. That is to say, power can be turned off except while valid data is held on the address sequence of the memory cell array 41. Accordingly, memory leakage currents can be reduced. As a result, the power consumption of the memory cell array 41 can be reduced.

In addition, the switch SW(0) is turned on in the initial state. Therefore, the beginning of arbitrary writing can be dealt with. In addition, the number of switches SW turned on in advance can be minimized, so power consumption can be reduced.

A semiconductor memory according to a second embodiment will now be described.

Figure 3:
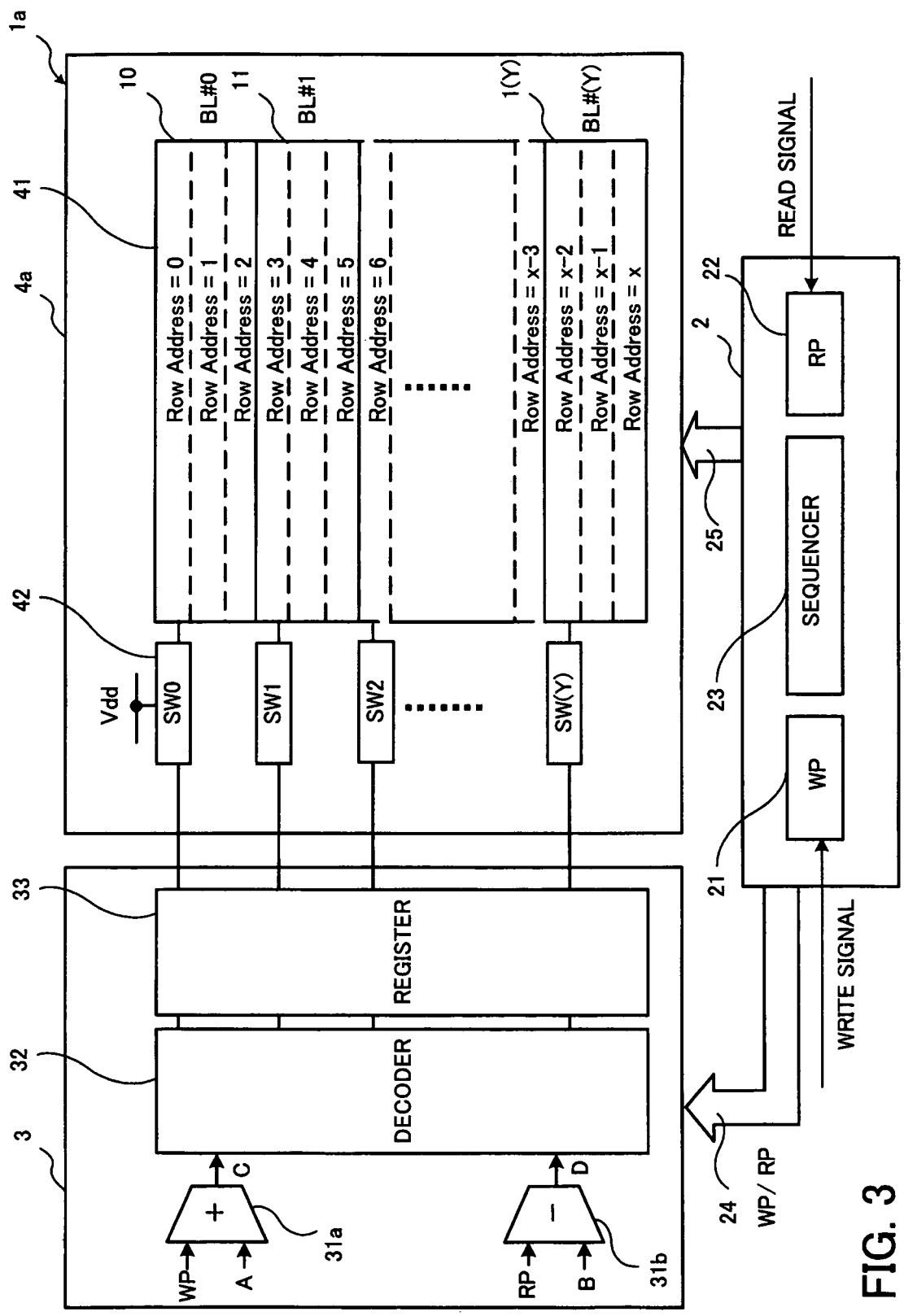
FIG. 3 is a block diagram showing a semiconductor memory according to a second embodiment.

FIG. 3 is a block diagram showing a semiconductor memory according to a second embodiment.

The differences between the above semiconductor memory 1 according to the first embodiment and a semiconductor memory 1*a* according to the second embodiment will now be described. Descriptions of the same matters will be omitted.

The semiconductor memory 1*a* according to the second embodiment includes a memory proper 4*a* in which a memory cell array 41 is made up of blocks (BL) each including a plurality of (three, in this embodiment) row addresses. The semiconductor memory 1*a* according to the second embodiment differs from the semiconductor memory 1 according to the first embodiment in this respect.

In this embodiment, row addresses 0, 1, and 2 make up a block the identification number of which is BL#0 and row addresses 3, 4, and 5 make up a block the identification number of which is BL#1. Similarly, row addresses (x−2), (x−1), and (x) make up a block the identification number of which is BL# (Y).

Hereinafter, the block the identification number of which is BL#0 is indicated by the block 10 and the block the identification number of which is BL#1 is indicated by the block 11. Similarly, the block the identification number of which is BL#(Y) is indicated by the block 1(Y).

A switch 42 includes switches SW0, SW1, . . . , SW (Y) which are connected to blocks. The switches SW0, SW1, . . . , SW(Y) are turned on according to blocks. For example, the switch SW0 is connected to word line driver power supply lines and cell power supply lines and bit line driver power supply lines and sence amp power supply lines corresponding to the row addresses which make up the block 10. When the switch SW0 is turned on, each of the row addresses 0, 1, and 2 goes into a writable state or a readable state.

An example of the operation of the semiconductor memory 1*a* according to the second embodiment will now be described.

Figure 4:
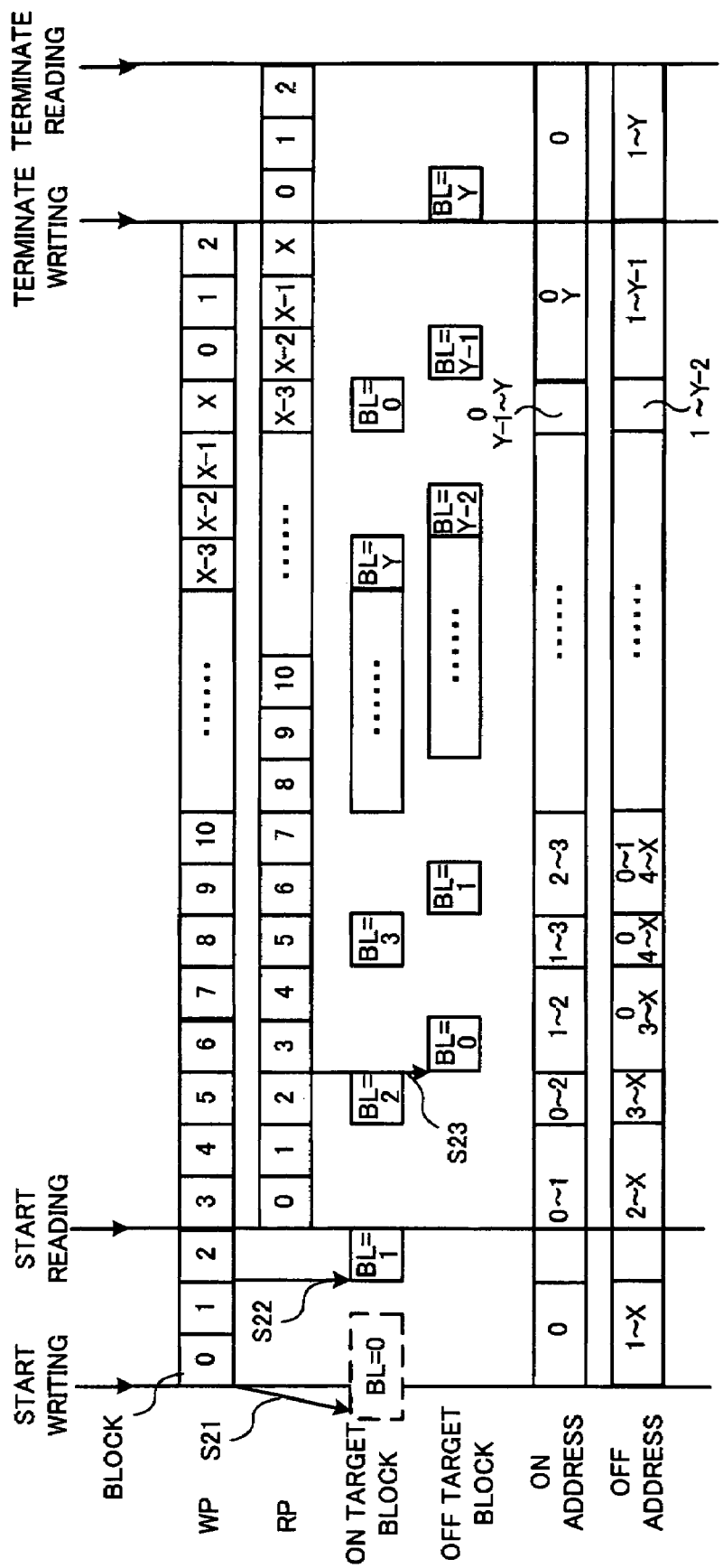
FIG. 4 is a timing chart showing an example of the operation of the semiconductor memory according to the second embodiment.

FIG. 4 is a timing chart showing an example of the operation of the semiconductor memory according to the second embodiment. In FIG. 4, an "on target block" means a block which becomes writable or readable at the time of a switch SW being turned on. An "off target block" means a block which becomes unwritable or unreadable at the time of a switch SW being turned off.

Before writing operation is begun, the switch SW0 corresponding to WP0 is turned on first (step S21).

After that, the writing operation is begun. When a row address that comes one, which is an address offset value, after a row address designated by a WP matches the row address 3 which is a leading row address in the block 11, that is to say, when WP=2, the switch SW1 is turned on (step S22).

After that, the WP is incremented by the writing operation. A switch SW corresponding to a block in which a leading row address matches a row address that comes one, which is an address offset value, after a row address designated by the WP is turned on. Switches SW are turned on in order in this way.

Reading operation is also begun. When a row address that comes one, which is an address offset value, before a row address designated by an RP matches the row address 2 which is a last row address in the block 10, that is to say, when RP=3, the switch SW0 is turned off (step S23).

After that, the RP is incremented by the reading operation. A switch SW corresponding to a block in which a last row address matches a row address that comes one, which is an address offset value, before a row address designated by the RP is turned off. The switches SW are turned off in order in this way.

With the semiconductor memory 1*a* according to the second embodiment, the same effect that is obtained by the semiconductor memory 1 according to the first embodiment can be achieved.

In addition, with the semiconductor memory 1*a* according to the second embodiment on/off control of the switches SW is exercised according to blocks. This reduces a load on each switch SW, a decoder 32, or a register 33. Therefore, power consumption can be reduced further.

A semiconductor memory according to a third embodiment will now be described.

Figure 5:
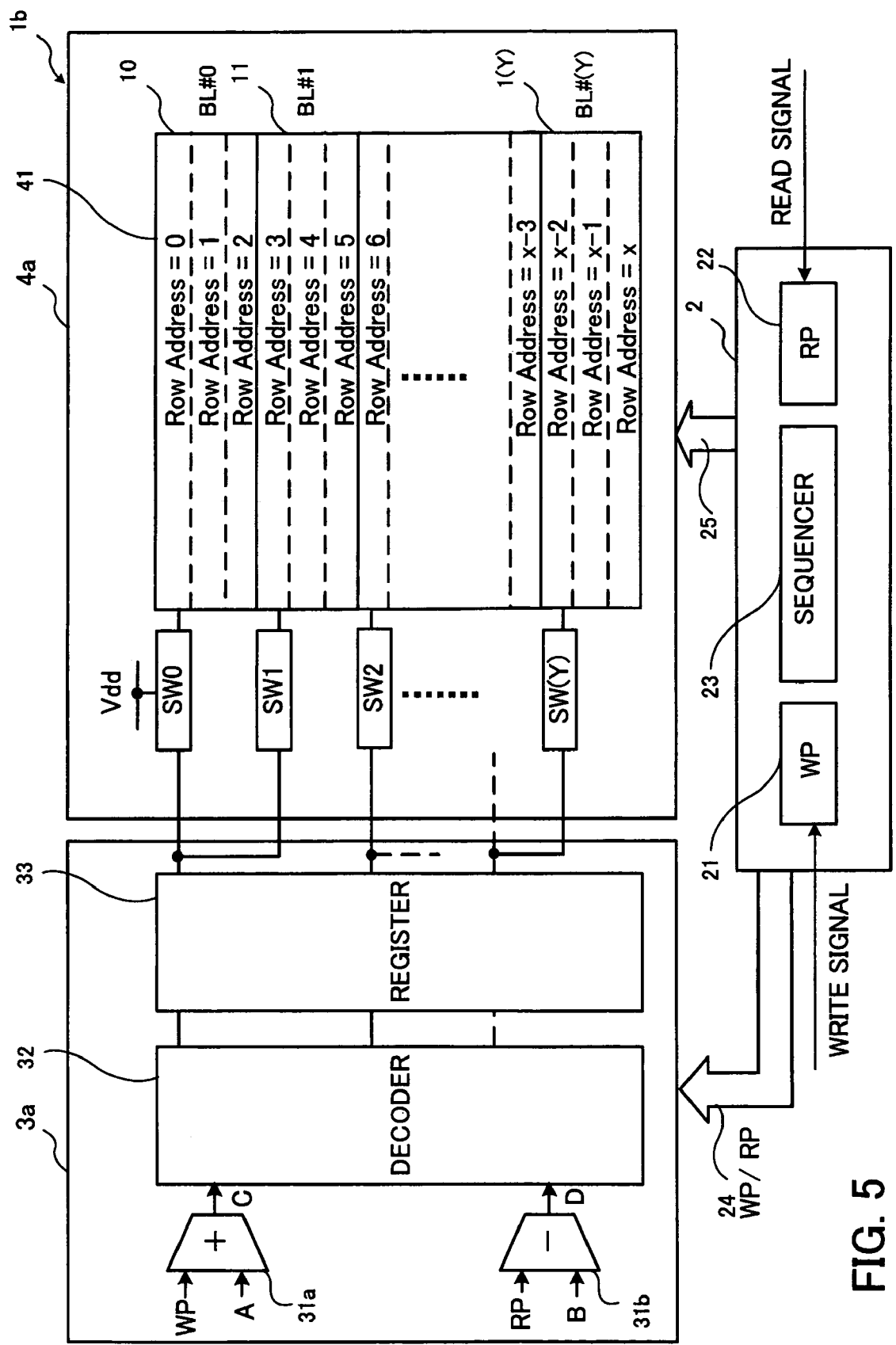
FIG. 5 is a block diagram showing a semiconductor memory according to a third embodiment.

FIG. 5 is a block diagram showing a semiconductor memory according to a third embodiment.

The differences between the above semiconductor memory 1*a* according to the second embodiment and a semiconductor memory 1*b* according to the third embodiment will now be described. Descriptions of the same matters will be omitted.

The semiconductor memory 1*b* according to the third embodiment includes a switch signal output section 3*a* for turning on/off switches SW corresponding to a plurality of blocks at the same time. The semiconductor memory 1*b* according to the third embodiment differs from the semiconductor memory 1a according to the second embodiment in this respect.

In this embodiment, each signal outputted from the switch signal output section 3a is sent to a plurality of (two, in this embodiment) switches SW. That is to say, the same decision logic is used in two adjacent blocks. As a result, when a row address that comes A, which is an address offset value, after a row address designated by a WP matches a leading row address in two adjacent blocks, switches SW connected to word line driver power supply lines and cell power supply lines included in these blocks are turned on. In addition, when a row address that comes C, which is an address offset value, before a row address designated by an RP matches a last row address in two adjacent blocks, switches SW connected to word line driver power supply lines and cell power supply lines included in these blocks are turned off.

An example of the operation of the semiconductor memory 1b according to the third embodiment will now be described.

Figure 6:
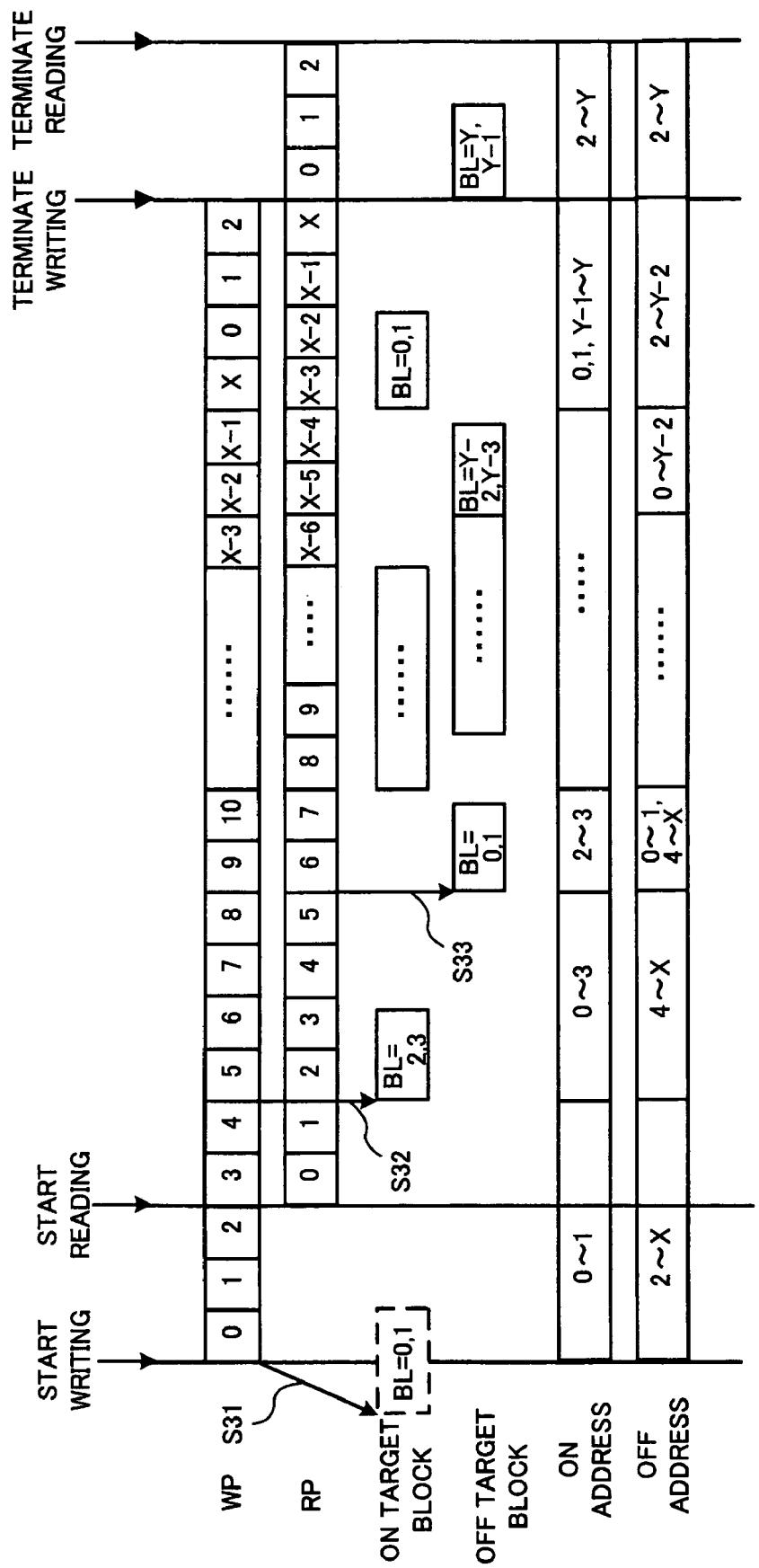
FIG. 6 is a timing chart showing an example of the operation of the semiconductor memory according to the third embodiment.

FIG. 6 is a timing chart showing an example of the operation of the semiconductor memory according to the third embodiment.

Before writing operation is begun, switches SW0 and SW1 are turned on first (step S31).

After that, the writing operation is begun. When a row address that comes one, which is an address offset value, after a row address designated by a WP matches the row address 6 which is a leading row address in blocks 12 and 13, that is to say, when WP=5, switches SW2 and SW3 are turned on (step S32).

After that, the WP is incremented by the writing operation. Switches SW corresponding to two adjacent blocks in which a leading row address matches a row address that comes one, which is an address offset value, after a row address designated by the WP are turned on. Switches SW are turned on in order in this way.

Reading operation is also begun. When a row address that comes one, which is an address offset value, before a row address designated by an RP matches the row address 5 which is a last row address in blocks 10 and 11, that is to say, when RP=6, the switches SW0 and SW1 are turned off (step S33).

After that, the RP is incremented by the reading operation. Switches SW corresponding to two adjacent blocks in which a last row address matches a row address that comes one, which is an address offset value, before a row address designated by the RP are turned off. The switches SW are turned off in order in this way.

With the semiconductor memory 1b according to the third embodiment, the same effect that is obtained by the semiconductor memory 1a according to the second embodiment can be achieved.

In addition, a plurality of switches SW included in the semiconductor memory 1b according to the third embodiment are turned on/off by one switch signal, so efficient control can be exercised.

This embodiment may be applied only to the case where the switches SW are turned on or only to the case where the switches SW are turned off.

In the above descriptions of this embodiment, switches SW corresponding to two adjacent blocks are turned on/off at the same time. However, switches SW corresponding to another combination of blocks may be turned on/off at the same time.

A semiconductor memory according to a fourth embodiment will now be described.

Figure 7:
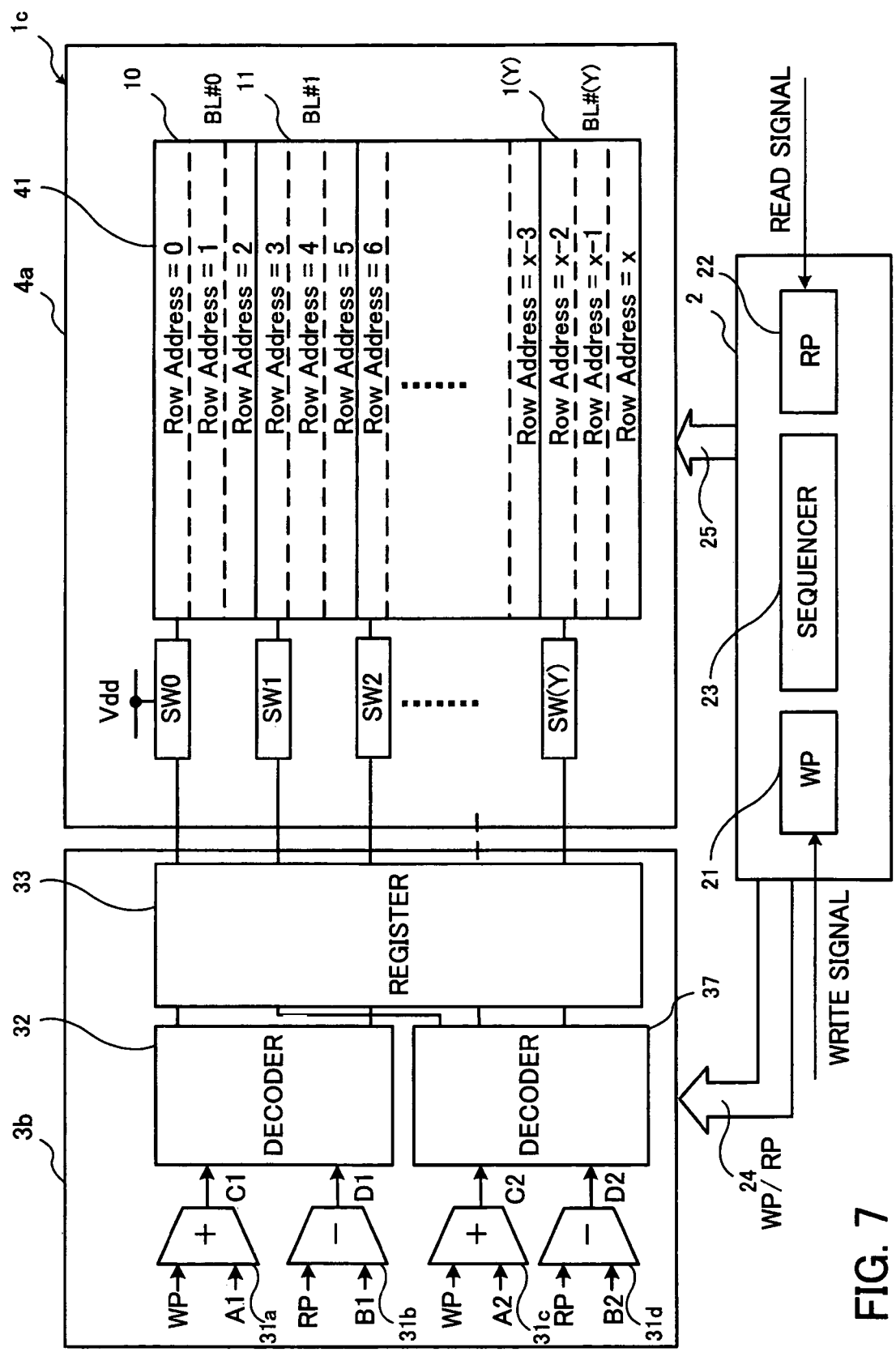
FIG. 7 is a block diagram showing a semiconductor memory according to a fourth embodiment.

FIG. 7 is a block diagram showing a semiconductor memory according to a fourth embodiment.

The differences between the above semiconductor memory 1a according to the second embodiment and a semiconductor memory 1c according to the fourth embodiment will now be described. Descriptions of the same matters will be omitted.

The semiconductor memory 1c according to the fourth embodiment differs from the semiconductor memory 1a according to the second embodiment in that it includes a switch signal output section 3b.

Unlike the switch signal output section 3, the switch signal output section 3b further includes an operation unit 31c having the same function as an operation unit 31a, an operation unit 31d having the same function as an operation unit 31b, and a decoder 37 for decoding address signals C2 and D2 generated by the operation units 31c and 31d respectively.

The operation unit 31a generates an address signal C1 from a WP outputted from an address control section 2 and the offset value A1 and outputs the address signal C1.

The operation unit 31b generates an address signal D1 from an RP outputted from the address control section 2 and the offset value B1 and outputs the address signal D1.

The operation unit 31c generates the address signal C2 from the WP outputted from the address control section 2 and the offset value A2 and outputs the address signal C2.

The operation unit 31d generates the address signal D2 from the RP outputted from the address control section 2 and the offset value B2 and outputs the address signal D2.

A decoder 32 outputs a switch signal to a switch SW connected to each of blocks bearing even numbers (block 11, block 13, ..., and block (Y−1)). The decoder 37 outputs a switch signal to a switch SW connected to each of blocks bearing odd numbers (block 10, block 12, ..., and block (Y)).

An example of the operation of the semiconductor memory 1c according to the fourth embodiment will now be described.

Figure 8:
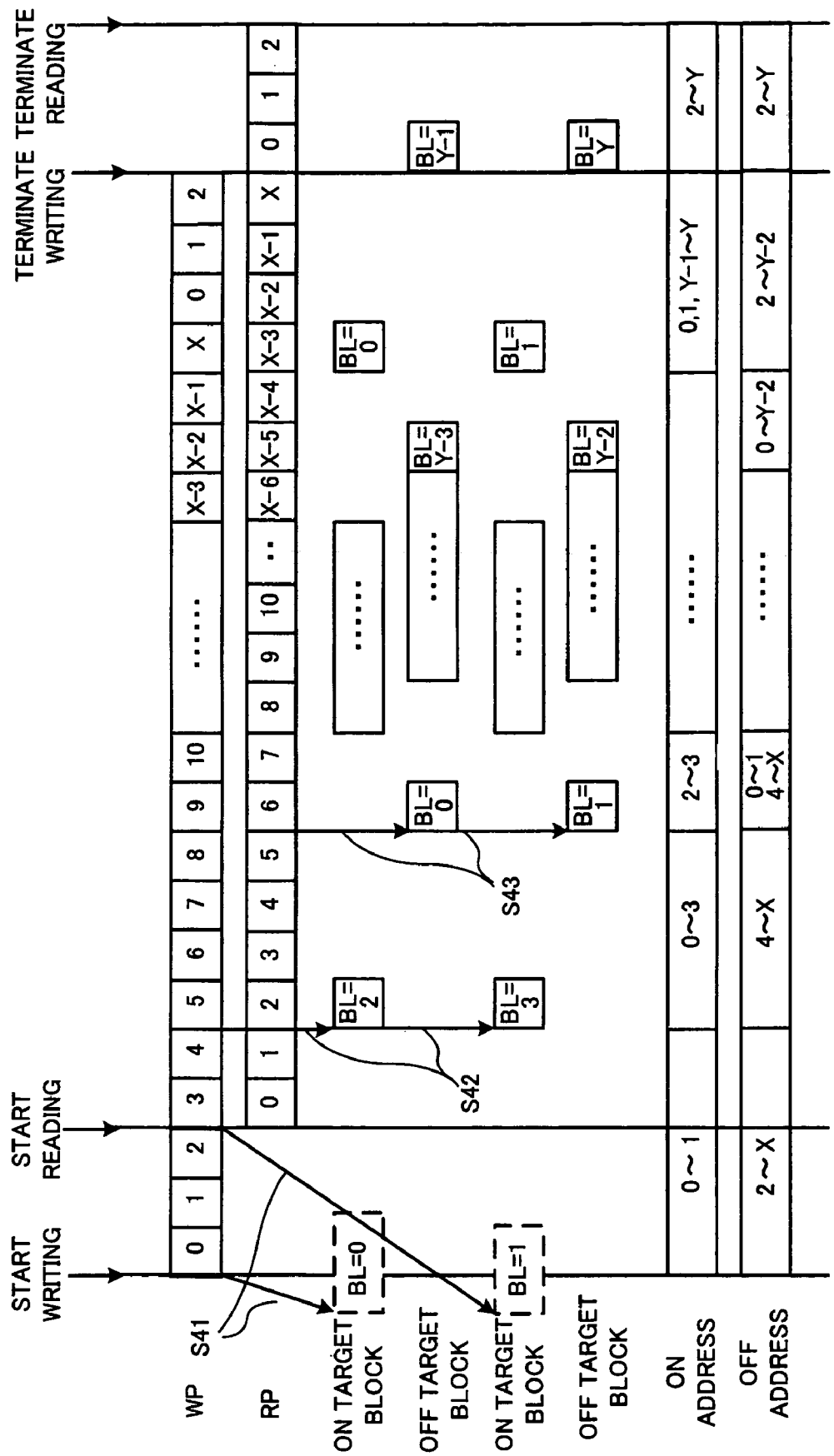
FIG. 8 is a timing chart showing an example of the operation of the semiconductor memory according to the fourth embodiment.

FIG. 8 is a timing chart showing an example of the operation of the semiconductor memory according to the fourth embodiment.

It is assumed that offset value A1=1, offset value B1=4, offset value A2=4, and offset value B2=1.

Before writing operation is begun, a switch SW0 is turned on first. In addition, a switch SW1 is turned on (step S41).

After that, the writing operation is begun. When a row address that comes one, which is an address offset value, after a row address designated by a WP matches the row address 6 which is a leading row address in the block 12, that is to say, when WP=5, a switch SW2 is turned on. Furthermore, when a row address that comes four, which is an address offset value, after the row address designated by the WP matches the row address 9 which is a leading row address in the block 13, that is to say, when WP=5, a switch SW3 is turned on (step S42).

After that, the WP is incremented by the writing operation. A switch SW corresponding to a block which bears an even number and in which a leading row address matches a row address that comes one, which is an address offset value, after a row address designated by the WP is turned on. Switches SW are turned on in order in this way. In addition, a switch SW corresponding to a block which bears an odd number and in which a leading row address matches a row address that comes four, which is an address offset value, after the row address designated by the WP is turned on. Switches SW are turned on in order in this way.

Reading operation is also begun. When a row address that comes four, which is an address offset value, before a row address designated by an RP matches the row address 2 which is a last row address in the block 10, that is to say, when RP=6, the switch SW0 is turned off. Furthermore, when a row address that comes one, which is an address offset value, before the row address designated by the RP matches the row address which is a last row address in the block 11, that is to say, when RP=6, the switch SW1 is turned off (step S43).

After that, the RP is incremented by the reading operation. A switch SW corresponding to a block which bears an even number and in which a last row address matches a row address that comes four, which is an address offset value, before a row address designated by the RP is turned off. The switches SW are turned off in order in this way. Furthermore, a switch SW corresponding to a block which bears an odd number and in which a last row address matches a row address that comes one, which is an address offset value, before the row address designated by the RP is turned off. The switches SW are turned off in order in this way.

With the semiconductor memory 1*c* according to the four embodiment, the same effect that is obtained by the semiconductor memory 1*a* according to the second embodiment can be achieved.

In addition, with the semiconductor memory 1*c* according to the four embodiment a plurality of blocks can be controlled like one block.

This embodiment may be applied only to the case where the switches SW are turned on or only to the case where the switches SW are turned off.

A semiconductor memory according to a fifth embodiment will now be described.

Figure 9:
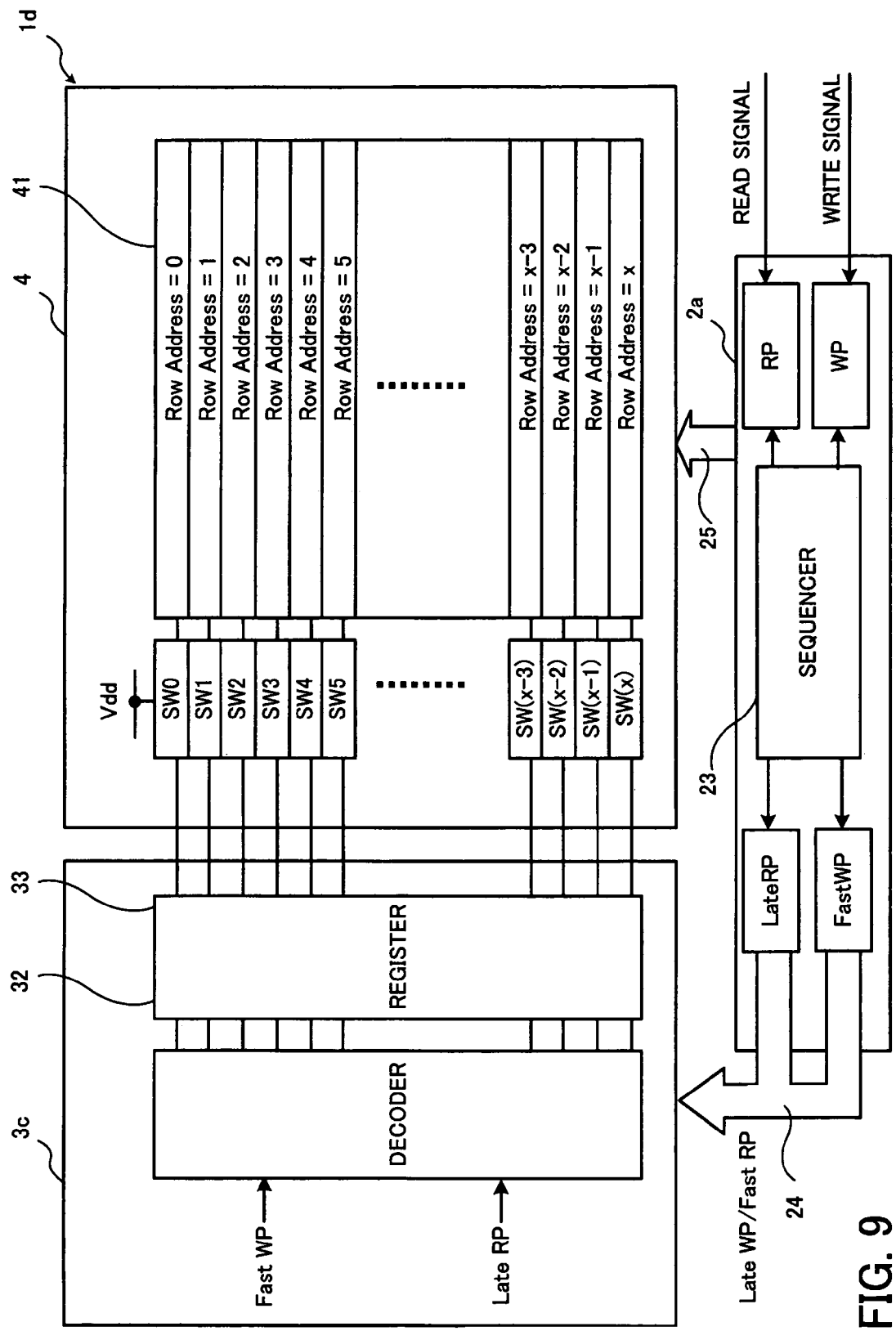
FIG. 9 is a block diagram showing a semiconductor memory according to a fifth embodiment.

FIG. 9 is a block diagram showing a semiconductor memory according to a fifth embodiment.

The differences between the above semiconductor memory 1 according to the first embodiment and a semiconductor memory 1*d* according to the fifth embodiment will now be described. Descriptions of the same matters will be omitted.

The semiconductor memory 1*d* according to the fifth embodiment includes an address control section 2*a* and a switch signal output section 3*c*. The address control section 2*a* exercises control by the use of an address generated by a sequencer 23. That is to say, the FIFO control (serial write-read control) is not exercised. The semiconductor memory 1*d* according to the fifth embodiment differs from the semiconductor memory 1 according to the first embodiment in this respect.

The address control section 2*a* uses the sequencer 23 for generating an address value (hereinafter referred to as the "FastWP") that comes, according to sequence, the offset value "A" before a row address indicated by a WP and generating an address value (hereinafter referred to as the "LateRP") that comes, according to sequence, the offset value "B" after a row address indicated by an RP.

A decoder 32 decodes the FastWP and LateRP inputted and generates switch signals P0 through P(x).

The operation of the semiconductor memory 1*d* according to the fifth embodiment will now be described.

When a write signal is inputted to the address control section 2*a*, the sequencer 23 generates the FastWP and outputs the FastWP to the switch signal output section 3*c*. In addition, the sequencer 23 generates a WP which indicates a row address that comes A, which is an offset value, before the row address indicated by the FastWP. The address control section 2*a* outputs the WP to a memory proper 4.

When a read signal is inputted to the address control section 2*a*, the sequencer 23 generates the RP and outputs the RP to the memory proper 4. In addition, the sequencer 23 generates the LateRP that comes B, which is an offset value, before the row address designated by the RP, and outputs the LateRP to the switch signal output section 3*c*.

The decoder 32 decodes the FastWP and LateRP inputted and generates the switch signals P0 through P(x).

An example of the operation of the semiconductor memory 1*d* according to the fifth embodiment will now be described.

Figure 10:
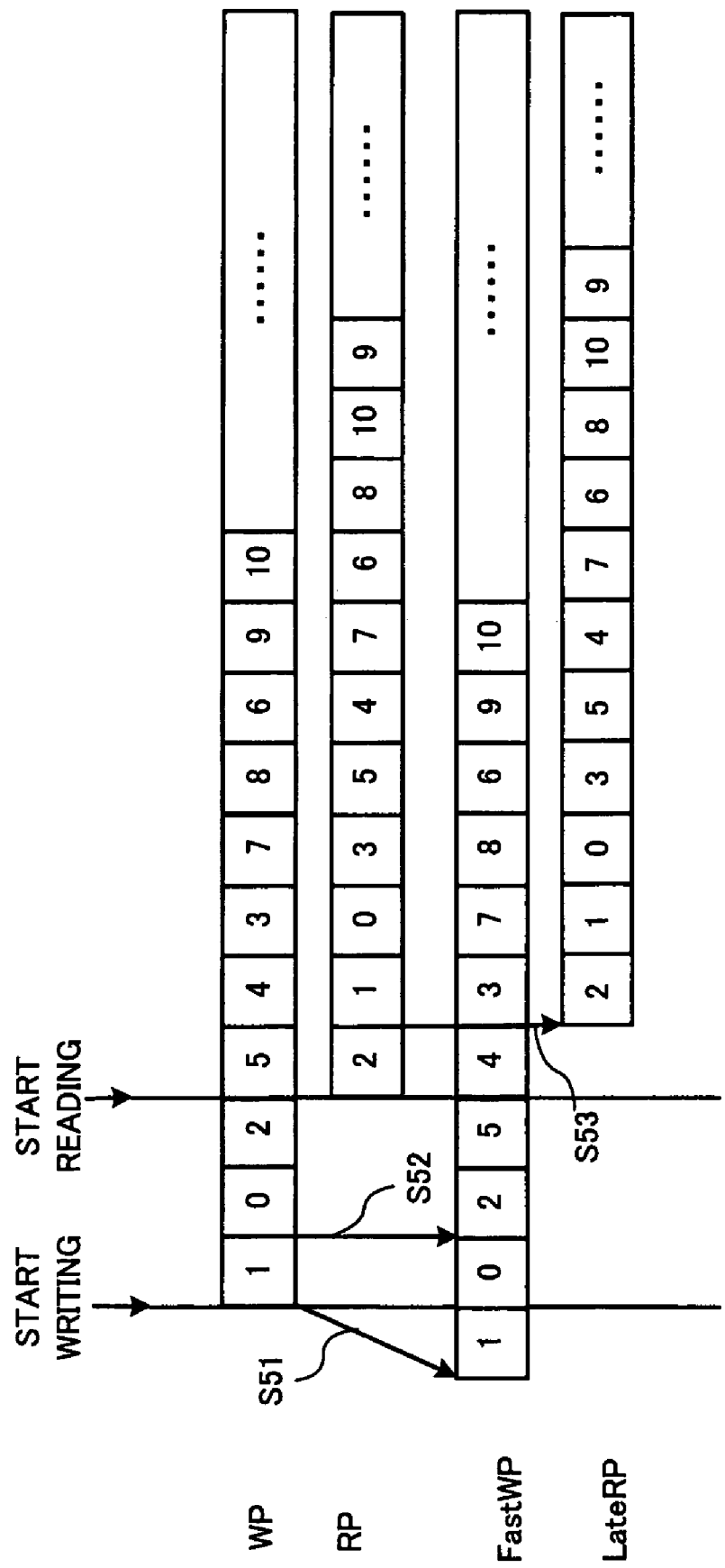
FIG. 10 is a timing chart showing an example of the operation of the semiconductor memory according to the fifth embodiment.

FIG. 10 is a timing chart showing an example of the operation of the semiconductor memory according to the fifth embodiment.

Before writing operation is begun, a switch SW0 is turned on first (step S51).

After that, the writing operation is begun. A switch SW corresponding to a row address that is designated by a FastWP and that comes one, which is an address offset value, after a row address designated by a WP is turned on. That is to say, when WP=0, FastWP=2 and a switch SW2 is turned on (step S52).

After that, the WP is incremented by the writing operation. A switch SW corresponding to a row address that is designated by the FastWP and that comes one, which is an address offset value, after a row address designated by the WP is turned on. Switches SW are turned on in order in this way.

Reading operation is also begun. A switch SW corresponding to a row address that is designated by a LateRP and that comes one, which is an address offset value, before a row address designated by an RP is turned off. That is to say, when RP=1, LateRP=2 and the switch SW2 is turned off (step S53).

After that, the RP is incremented by the reading operation. A switch SW corresponding to a row address that is designated by the LateRP and that comes one, which is an address offset value, before a row address designated by the RP is turned off. The switches SW are turned off in order in this way.

With the semiconductor memory 1*d* according to the fifth embodiment, the same effect that is obtained by the semiconductor memory 1 according to the first embodiment can be achieved.

In addition, with the semiconductor memory 1*d* according to the fifth embodiment the FastWP and the LateRP are generated. As a result, the present invention can also be applied to a memory cell array in which control other than the FIFO (serial address control) is exercised.

A semiconductor memory according to a sixth embodiment will now be described.

Figure 11:
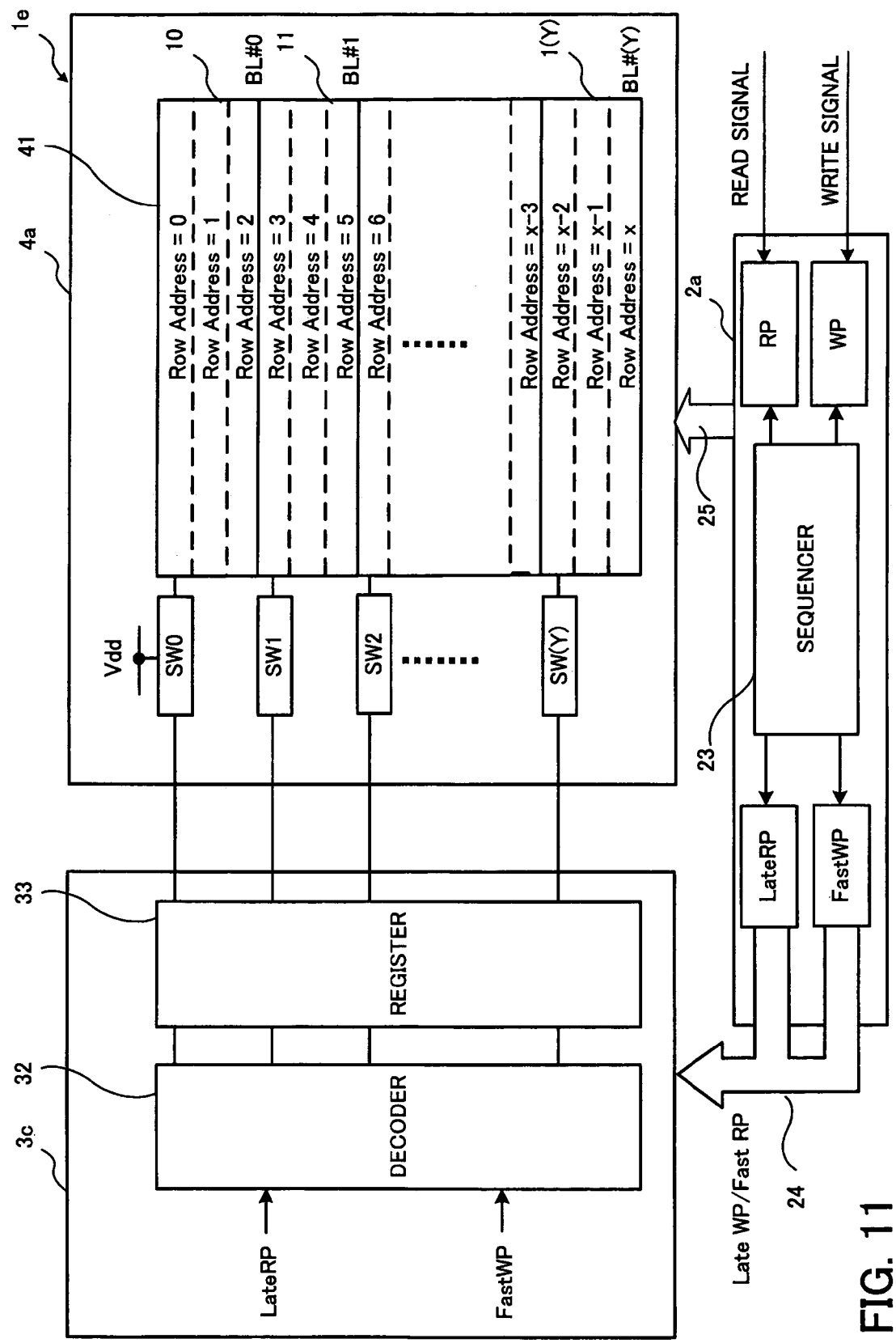
FIG. 11 is a block diagram showing a semiconductor memory according to a sixth embodiment.

FIG. 11 is a block diagram showing a semiconductor memory according to a sixth embodiment.

The differences between the above semiconductor memory 1*d* according to the fifth embodiment and a semiconductor memory 1*e* according to the sixth embodiment will now be described. Descriptions of the same matters will be omitted.

The semiconductor memory 1*e* according to the sixth embodiment includes a switch signal output section 3*c* and a memory proper 4*a*. A memory cell array 41 is made up of blocks (BL) each including a plurality of (three, in this embodiment) row addresses. The semiconductor memory 1*e* according to the sixth embodiment differs from the semiconductor memory 1 according to the first embodiment in this respect.

Furthermore, in this embodiment a switch SW corresponding to a block is turned on when a row address designated by a FastWP matches a row address in the block to which writing is performed first according to sequence.

An example of the operation of the semiconductor memory 1*e* according to the sixth embodiment will now be described.

Figure 12:
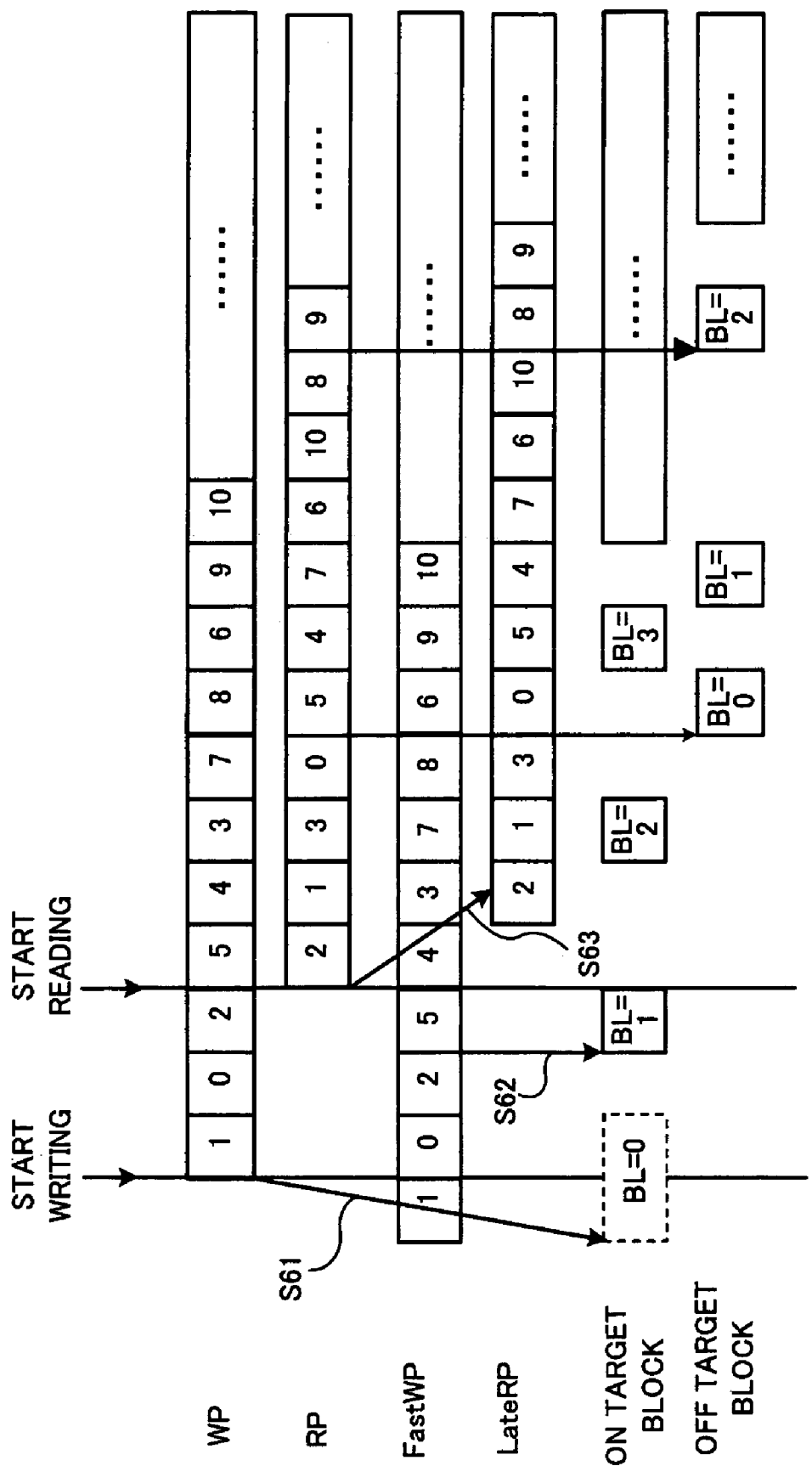
FIG. 12 is a timing chart showing an example of the operation of the semiconductor memory according to the sixth embodiment.

FIG. 12 is a timing chart showing an example of the operation of the semiconductor memory according to the sixth embodiment.

Before writing operation is begun, a switch SW0 is turned on first (step S61).

After that, the writing operation is begun. When a row address that is designated by a FastWP and that comes one, which is an address offset value, after a row address designated by a WP matches the row address 5 to which writing is performed first in a block 11, that is to say, when FastWP=5, a switch SW2 is turned on (step S62).

After that, the WP is incremented by the writing operation. A switch SW corresponding to a block in which a leading row address matches a row address that is designated by the FastWP and that comes one, which is an address offset value, after a row address designated by the WP is turned on. Switches SW are turned on in order in this way.

Reading operation is also begun. The switch SW0 is turned off when a row address that is designated by a LateRP and that comes one, which is an address offset value, before a row address designated by an RP matches a row address from which reading is performed last in a block 10, that is to say, when LateRP=0 (step S63).

After that, the RP is incremented by the reading operation. A switch SW corresponding to a block in which a row address from which reading is performed last matches a row address that is designated by the LateRP and that comes one, which is an address offset value, before a row address designated by the RP is turned off. The switches SW are turned off in order in this way.

With the semiconductor memory 1e according to the sixth embodiment, the same effect that is obtained by the semiconductor memory 1d according to the fifth embodiment can be achieved.

In addition, with the semiconductor memory 1e according to the sixth embodiment on/off control of switches SW is exercised according to blocks. This reduces a load on each switch SW, a decoder 32, or a register 33. Therefore, power consumption can be reduced further.

A semiconductor memory according to a seventh embodiment will now be described.

Figure 13:
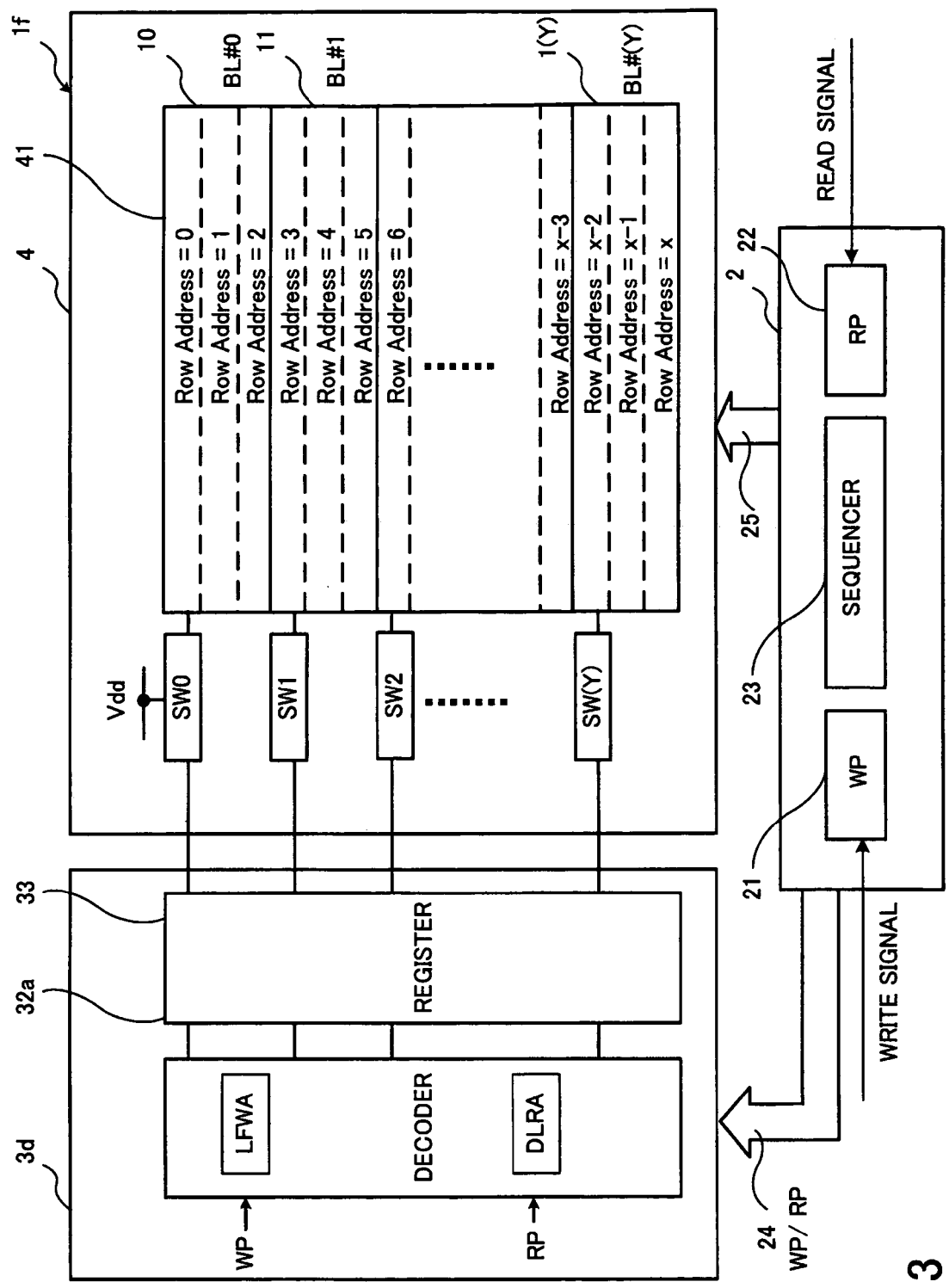
FIG. 13 is a block diagram showing a semiconductor memory according to a seventh embodiment.

FIG. 13 is a block diagram showing a semiconductor memory according to a seventh embodiment.

The differences between the above semiconductor memory 1e according to the sixth embodiment and a semiconductor memory 1f according to the seventh embodiment will now be described. Descriptions of the same matters will be omitted.

The semiconductor memory 1f according to the seventh embodiment includes an address control section 2 and a switch signal output section 3d including a decoder 32a. The address control section 2 does not generate a FastWP or a LateRP. When a row address (hereinafter referred to as the "LFWA") that comes, according to sequence, the address offset value "A" before a row address in a block to which writing is performed first according to the sequence matches a row address designated by a WP, a switch SW corresponding to the block is turned on. The decoder 32a generates one of switch signals P0 through P(x) to turn on the switch SW corresponding to the block. When a row address (hereinafter referred to as the "DLRA") that comes, according to sequence, the address offset value "B" (not after a row address which is a last row address in a block but) after a row address in a block from which reading is performed last according to the sequence matches a row address designated by an RP, a switch SW corresponding to the block is turned off. The decoder 32a generates one of the switch signals P0 through P(x) to turn off the switch SW corresponding to the block.

An example of the operation of the semiconductor memory 1f according to the seventh embodiment will now be described.

Figure 14:
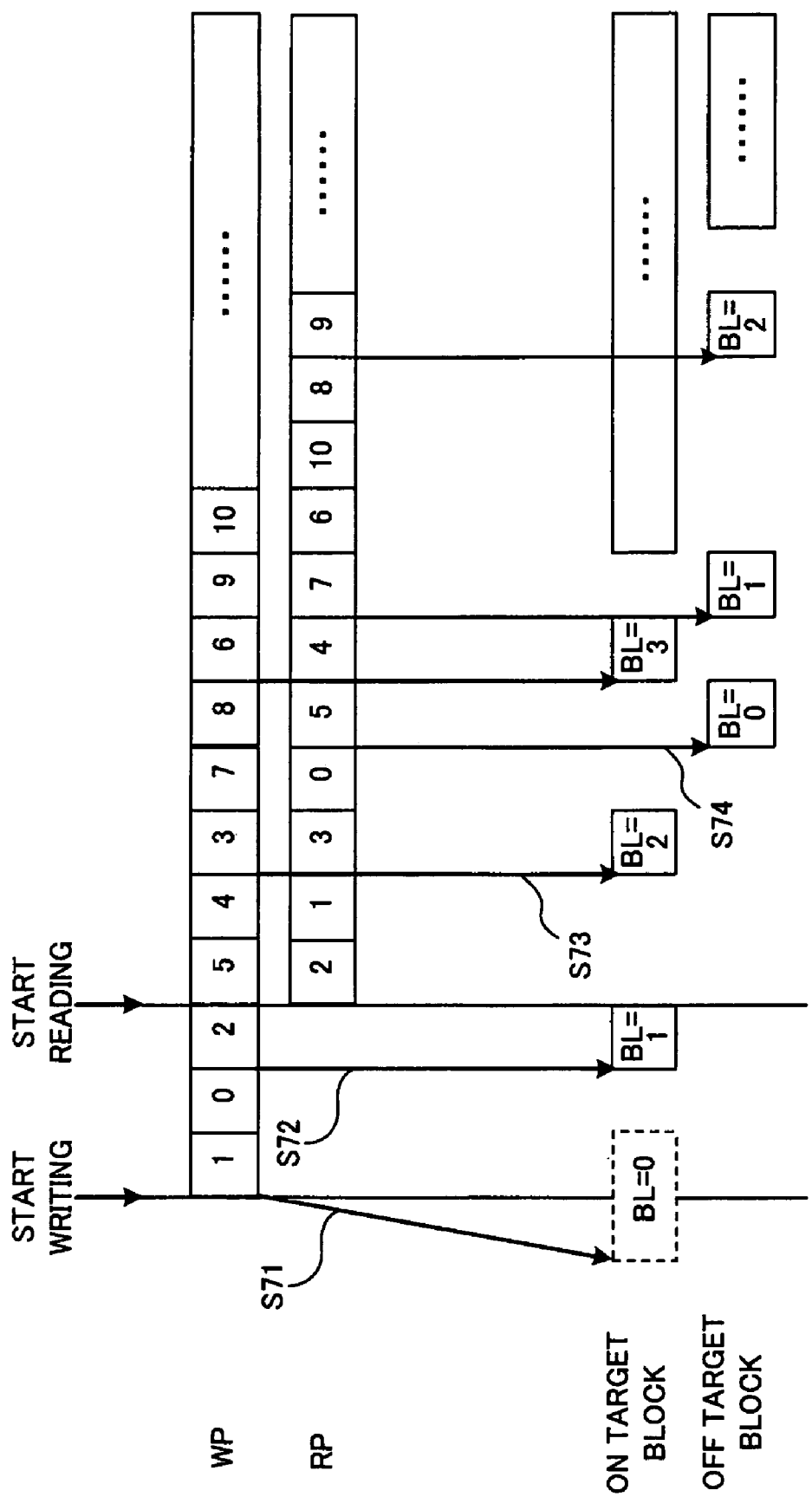
FIG. 14 is a timing chart showing an example of the operation of the semiconductor memory according to the seventh embodiment.

FIG. 14 is a timing chart showing an example of the operation of the semiconductor memory according to the seventh embodiment.

It is assumed that A (address offset value)=1 and that B (address offset value)=1.

Before writing operation is begun, a switch SW0 is turned on first (step S71).

After that, the writing operation is begun. The decoder 32a sets the address value "2" that comes, according to sequence, the address offset value "one" before the row address "5" (WP=5) to which writing is performed first in a block 11 according to the sequence as the LFWA. When WP=2 is inputted to the decoder 32a, the decoder 32a outputs the switch signal P1 for turning on a switch SW1. As a result, the switch SW1 is turned on (step S72).

After that, the decoder 32a sets the address value "3" that comes, according to the sequence, the address offset value "one" before the row address "7" (WP=7) to which writing is performed first in a block 12 according to the sequence as the LFWA. When WP=3 is inputted to the decoder 32a, the decoder 32a outputs the switch signal P2 for turning on a switch SW2. As a result, the switch SW2 is turned on (step S73).

The decoder 32a sets the address value "5" that comes, according to sequence, the address offset value "one" after the row address "0" (RP=0) from which reading is performed last in a block 10 according to the sequence as the DLRA. When RP=5 is inputted to the decoder 32a, the decoder 32a outputs the switch signal P0 for turning off the switch SW0. As a result, the switch SW0 is turned off (step S74).

After that, the operation is performed in the same way.

With the semiconductor memory 1f according to the seventh embodiment, the same effect that is obtained by the semiconductor memory 1e according to the sixth embodiment can be achieved.

In addition, with the semiconductor memory 1f according to the seventh embodiment there is no need to make a change in the address control section. As a result, the structure of the semiconductor memory can be simplified.

In this embodiment, blocks are arranged in order of row address. However, the order in which the blocks are arranged is not limited to this. For example, the blocks may be arranged according to address sequence. In this case, row addresses are not arranged in serial order. By doing so, decode logic can be simplified and time taken to turn on power to a block can be shortened.

A semiconductor memory according to an eighth embodiment will now be described.

Figure 15:
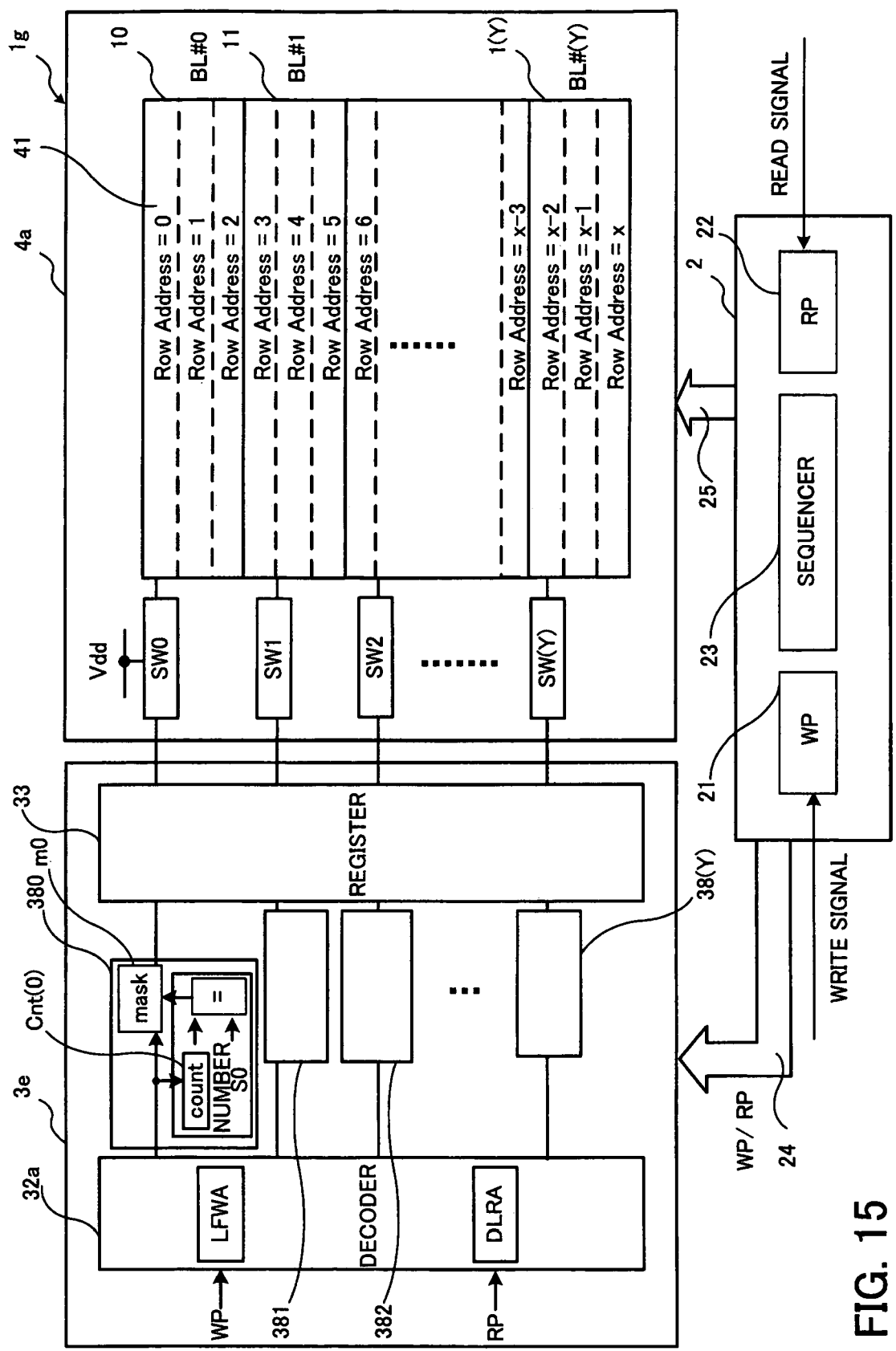
FIG. 15 is a block diagram showing a semiconductor memory according to an eighth embodiment.

FIG. 15 is a block diagram showing a semiconductor memory according to an eighth embodiment.

The differences between the above semiconductor memory 1f according to the seventh embodiment and a semiconductor memory 1g according to the eighth embodiment will now be described. Descriptions of the same matters will be omitted.

The semiconductor memory 1g according to the eighth embodiment includes a switch signal output section 3e in which logic for determining whether the number of times access is performed matches a number set in advance is added to on/off control of switches SW. The semiconductor memory 1g according to the eighth embodiment differs from the semiconductor memory 1f according to the seventh embodiment in this respect.

The switch signal output section 3e includes a decoder 32a, a register 33, and mask circuits 380, 381, and 382 through 38(Y).

The mask circuits 380 through 38(Y) are located between an output section of the decoder 32a and an input section of the register 33.

The mask circuits 380 through 38(Y) will now be described. Each of the mask circuits 380 through 38(Y) has the same structure, so only the mask circuit 380 will be described.

The mask circuit 380 includes a count unit Cnt(0) and a signal mask unit m0.

The count unit Cnt(0) uses a counter for counting the number of signals which indicate that a WP matches an LFWA. If the counter reaches a number S0 set in advance, then the count unit Cnt(0) outputs a mask release signal.

In addition, the count unit Cnt(0) uses the counter for counting the number of signals which indicate that an RP matches a DLRA. If the counter reaches the number S0 set in advance, then the count unit Cnt(0) outputs the mask release signal.

In a state in which the mask release signal is not inputted, the signal mask unit m0 holds the logic of a switch signal inputted from the decoder 32a without outputting the switch signal to the register 33. When the mask release signal is inputted, the signal mask unit m0 outputs the switch signal. That is to say, if the signal mask unit m0 has received a switch signal for turning on a switch SW0, the signal mask unit m0 outputs the switch signal for turning on the switch SW0 to the register 33 at the time of receiving the mask release signal. If the signal mask unit m0 has received a switch signal for turning off the switch SW0, the signal mask unit m0 outputs the switch signal for turning off the switch SW0 to the register 33 at the time of receiving the mask release signal.

The count unit Cnt(0) counts the number of signals by which the determination that a WP matches an LFWA is made and the number of signals by which the determination that an RP matches a DLRA is made independently of each other.

An example of the operation of the semiconductor memory 1g according to the eighth embodiment will now be described.

Figure 16:
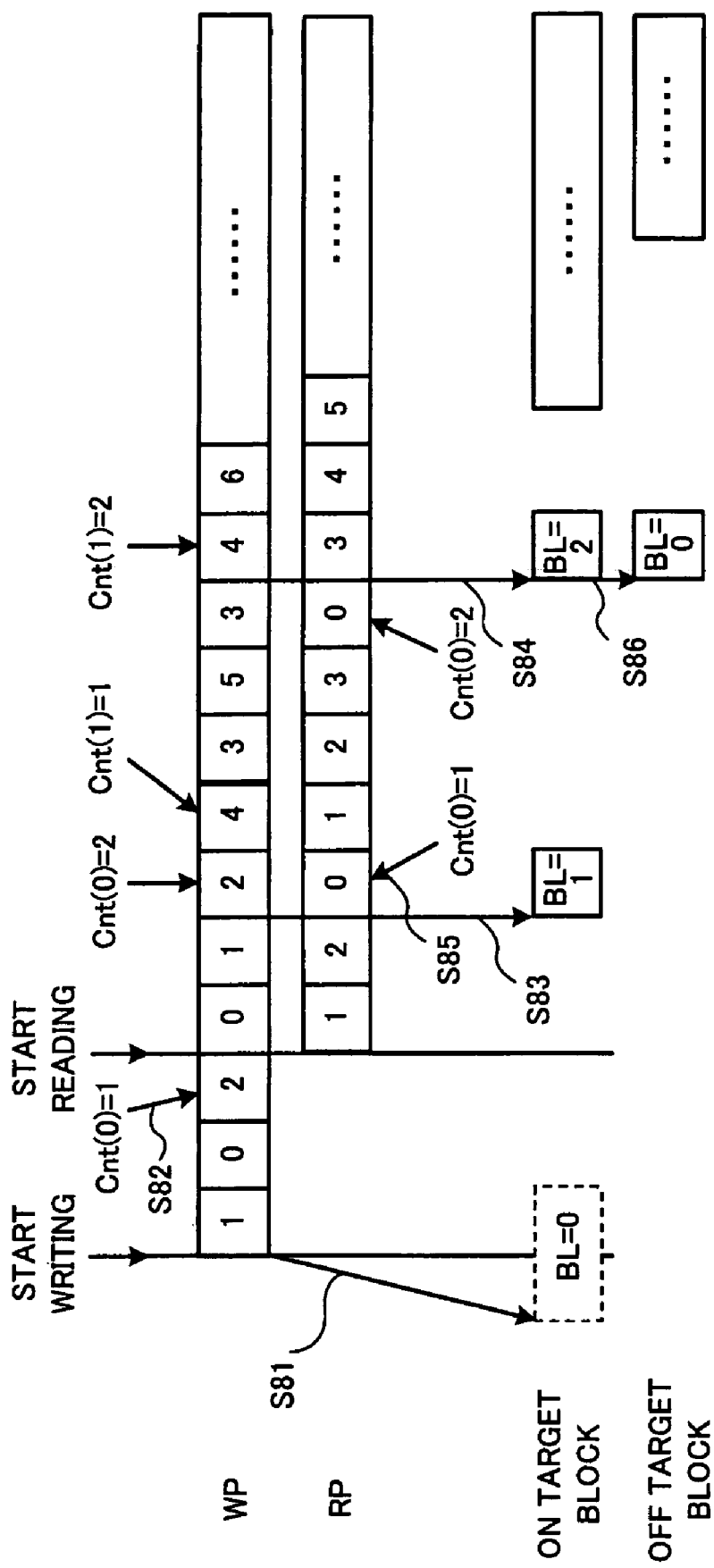
FIG. 16 is a timing chart showing an example of the operation of the semiconductor memory according to the eighth embodiment.

FIG. 16 is a timing chart showing an example of the operation of the semiconductor memory according to the eighth embodiment.

In the following descriptions, it is assumed that A (address offset value)=1, that B (address offset value)=1, and that each of numbers S0 through S(Y) is set to "2".

Before writing operation is begun, the switch SW0 is turned on first (step S81).

After that, the writing operation is begun. The decoder 32a sets the address value "2" that comes, according to sequence, the address offset value "one" before the row address "4" (WP=4) to which writing is performed first in a block 11 according to the sequence as the LFWA. When a first WP=2 is inputted to the decoder 32a, the decoder 32a outputs a switch signal P1 for turning on a switch SW1 to the mask circuit 380. As a result, the signal mask unit m0 holds the switch signal P1 for turning on the switch SW1. In addition, the count unit Cnt(0) of the mask circuit 380 increments the counter by one (step S82). When a second WP=2 is inputted to the decoder 32a, the decoder 32a outputs the switch signal P1 for turning on the switch SW1 to the mask circuit 380 again. The count unit Cnt(0) increments the counter by one. As a result, the counter of the count unit Cnt (0) reaches the value of S0 and the count unit Cnt (0) outputs the mask release signal to the signal mask unit m0. The signal mask unit m0 then outputs the switch signal P1 for turning on the switch SW1. Accordingly, the switch SW1 is turned on (step S83).

After that, the decoder 32a sets the address value "4" that comes, according to the sequence, the address offset value "one" before the row address "6" (WP=6) to which writing is performed first in a block 12 according to the sequence as the LFWA. A count unit Cnt(1) counts the number of times a WP matches the LFWA (=4). When a second WP=4 is inputted to the decoder 32a, the decoder 32a outputs a switch signal P2 for turning on a switch SW2. As a result, the switch SW2 is turned on (step S84).

Reading operation is also begun. The decoder 32a sets the address value "3" that comes, according to sequence, the address offset value "one" after the row address "0" (RP=0) from which reading is performed last in a block 10 according to the sequence as the DLRA. When a first RP=0 is inputted to the decoder 32a, the decoder 32a outputs a switch signal P0 for turning off the switch SW0 to the mask circuit 380. As a result, the signal mask unit m0 holds the switch signal P0 for turning off the switch SW0. In addition, the count unit Cnt (0) of the mask circuit 380 increments the counter by one (step S85). When a second RP=0 is inputted to the decoder 32a, the decoder 32a outputs the switch signal P0 for turning off the switch SW0 to the mask circuit 380 again. The count unit Cnt(0) increments the counter by one. As a result, the counter of the count unit Cnt(0) reaches the value of S0 and the count unit Cnt(0) outputs the mask release signal to the signal mask unit m0. The signal mask unit m0 then outputs the switch signal P0 for turning off the switch SW0. Accordingly, the switch SW0 is turned off (step S86).

After that, the operation is performed in the same way.

With the semiconductor memory 1g according to the eighth embodiment, the same effect that is obtained by the semiconductor memory 1f according to the seventh embodiment can be achieved.

In addition, the semiconductor memory 1g according to the eighth embodiment includes the mask circuits 380 through 38(Y). Accordingly, even if writing to or reading from the same addresses is performed more than one time according to sequence, a switch SW corresponding to each address can be turned on/off. In this case, a malfunction does not occur.

A semiconductor memory according to a ninth embodiment will now be described.

Figure 17:
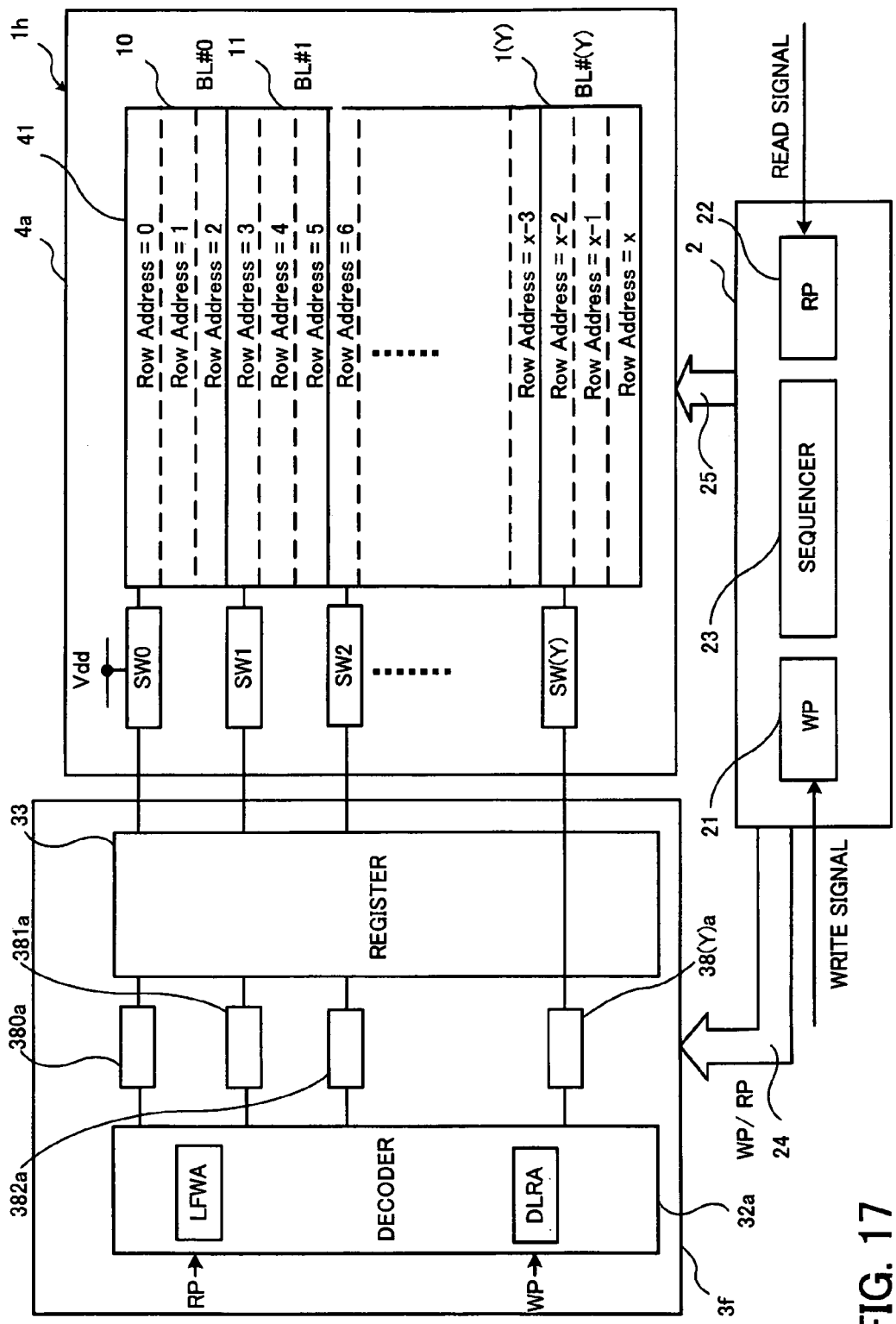
FIG. 17 is a block diagram showing a semiconductor memory according to a ninth embodiment.

FIG. 17 is a block diagram showing a semiconductor memory according to a ninth embodiment.

The differences between the above semiconductor memory 1g according to the eighth embodiment and a semiconductor memory 1h according to the ninth embodiment will now be described. Descriptions of the same matters will be omitted.

The semiconductor memory 1h according to the ninth embodiment includes a switch signal output section 3f including mask circuits 380a through 38(Y)a. The semiconductor memory 1h according to the ninth embodiment differs from the semiconductor memory 1g according to the eighth embodiment in this respect.

The mask circuits 380a through 38(Y)a include timers Tm0 through Tm(Y) respectively.

Each of the timers Tm0 through Tm(Y) is electrically connected to a clock (CLK) located outside the switch signal output section 3f.

The mask circuits 380a through 38(Y)a will now be described. Each of the mask circuits 380a through 38(Y)a has the same structure, so only the mask circuit 380a will be described.

Figure 18:
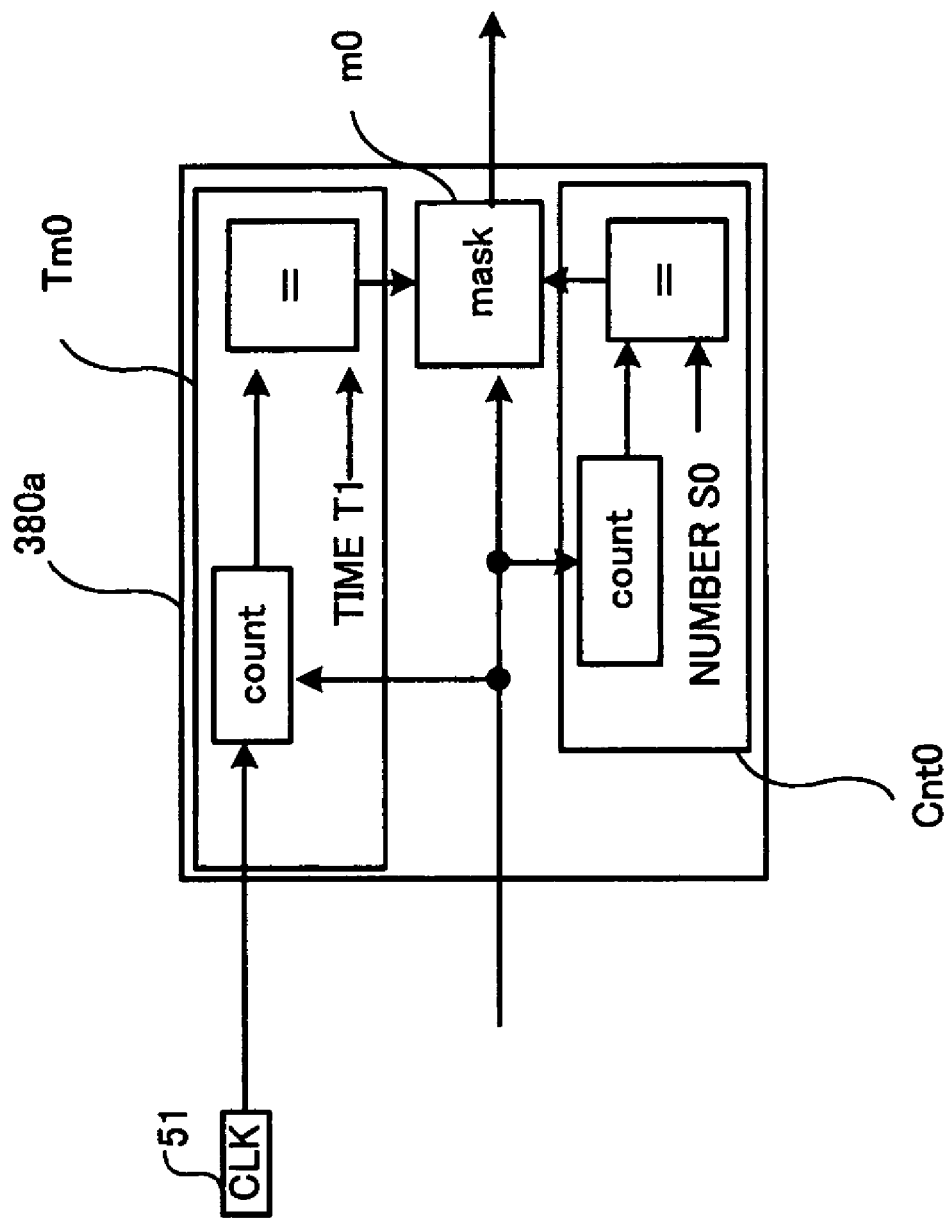
FIG. 18 is a block diagram showing a signal mask unit of the semiconductor memory according to the ninth embodiment.

FIG. 18 is a block diagram showing a signal mask unit of the semiconductor memory according to the ninth embodiment.

The timer Tm0 counts the number of CLK signals inputted from the CLK 51 to a counter included in the timer Tm0. Until the counter reaches a number corresponding to guard time T0, the timer Tm0 masks a switch signal P0 for turning off a switch SW0, that is to say, the timer Tm0 generates a mask signal in order not to change the state of the switch signal P0.

When the counter reaches the number corresponding to the guard time T0, the timer Tm0 generates a mask release signal in order to release the mask signal.

If a signal mask unit m0 receives a switch signal P0 for turning on the switch SW0 from a decoder 32a, then the signal mask unit m0 receives only a mask release signal sent from a count unit Cnt0 and outputs the switch signal P0 for turning on the switch SW0 to a register 33.

If the signal mask unit m0 receives the switch signal P0 for turning off the switch SW0 from the decoder 32a, then the signal mask unit m0 receives the mask release signal sent from the count unit Cnt0 and the mask release signal sent from the timer Tm0 and outputs the switch signal P0 for turning off the switch SW0 to the register 33.

An example of the operation of the semiconductor memory 1h according to the ninth embodiment will now be described.

Figure 19:
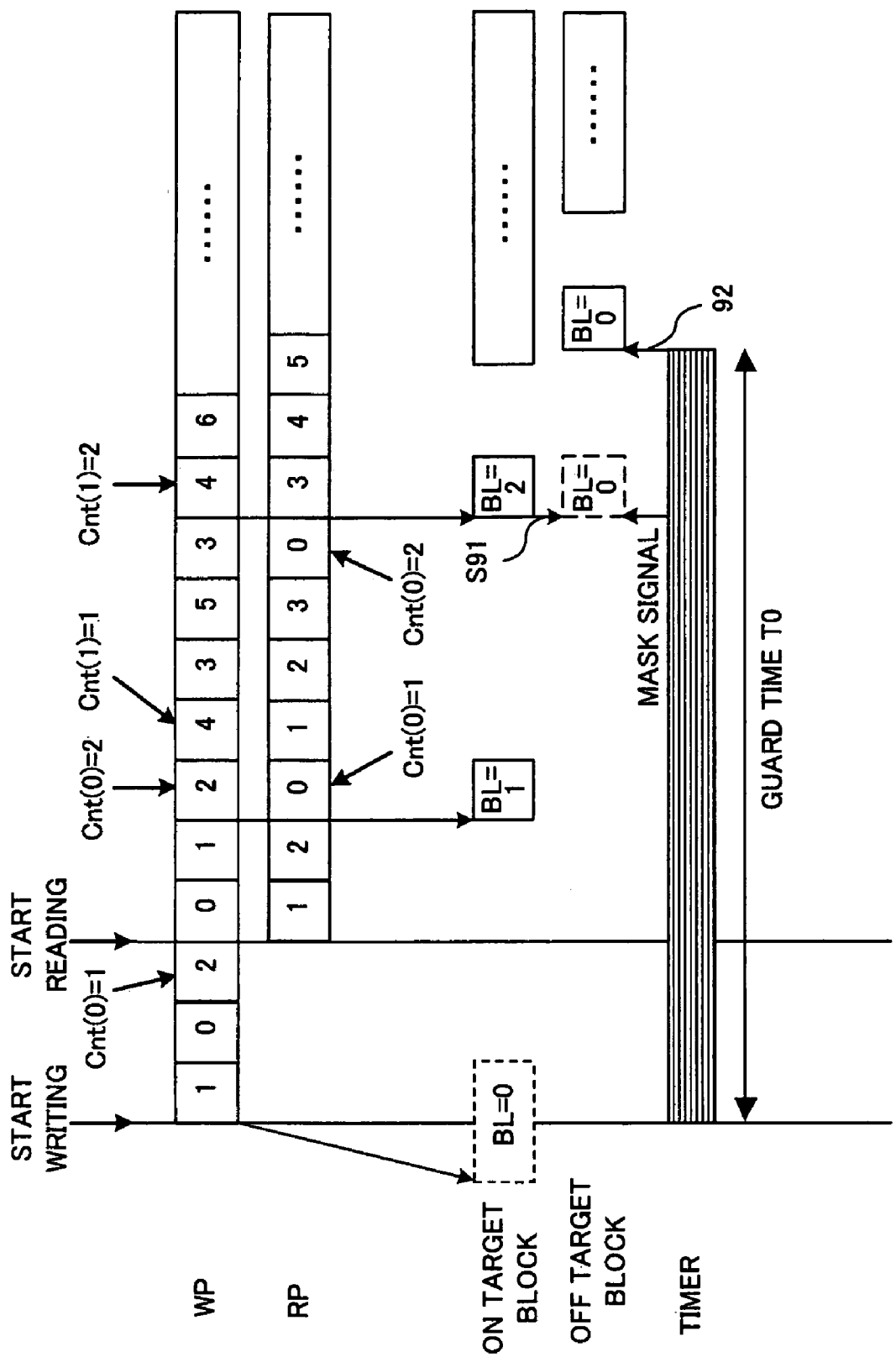
FIG. 19 is a timing chart showing an example of the operation of the semiconductor memory according to the ninth embodiment.

FIG. 19 is a timing chart showing an example of the operation of the semiconductor memory according to the ninth embodiment.

In the following descriptions it is assumed that each of numbers S0 through S(Y) is 1.

In FIG. 19, a "timer" indicates the guard time T0.

With the semiconductor memory 1h according to the ninth embodiment the guard time T0 begins to progress at the time of beginning writing. After that, the decoder 32a sets the address value "3" that comes, according to sequence, the address offset value "one" after the row address "0" (RP=0) from which reading is performed last in a block 10 according to the sequence as a DLRA. When a second RP=0 is inputted to the decoder 32a, the decoder 32a outputs again the switch signal P0 for turning off the switch SW0 (step S91). This is the same as step S86 in the operation of the semiconductor memory 1g according to the eighth embodiment.

The timer Tm0 is generating the mask signal during the guard time T0, so the signal mask unit m0 does not output the switch signal P0 inputted from the decoder 32a to the register 33 and holds logic of the switch signal P0. Accordingly, the switch SW0 is not turned off at this time. The timer Tm0 generates the mask release signal after the elapse of the guard time T0. As a result, the signal mask unit m0 outputs the switch signal P0 for turning off the switch SW0 to the register 33. Accordingly, the switch SW0 is turned off (step S92).

After that, the operation is performed in the same way.

With the semiconductor memory 1h according to the ninth embodiment, the same effect that is obtained by the semiconductor memory 1g according to the eighth embodiment can be achieved.

In addition, with the semiconductor memory 1h according to the ninth embodiment the number of times a switch SW is turned on/off can be reduced. As a result, power consumed by switching can be reduced.

In this embodiment, clocks are inputted from the CLK 51 to the timers Tm0 through Tm(Y). However, another method may be used. For example, output of various programmable counters may be inputted.

In this embodiment, the guard time T0 begins to progress at the time of beginning writing. However, the guard time T0 may begin to progress at any time. For example, the guard time T0 may begin to progress at the time of terminating writing.

In this embodiment, the mask circuits 380a through 38(Y)a include the timers Tm0 through Tm(Y) respectively. However, another method may be used. For example, a plurality of mask circuits may share a timer. In this case, there is no special limit to timing at which guard time of each timer begins to progress or ends. For example, timing at which guard time of a timer begins to progress or ends may be synchronized with timing at which guard time of another timer begins to progress or ends.

In this embodiment, the timer Tm0 generates the mask signal for masking the switch signal P0 for turning off the switch SW0 during the guard time T0. However, another method may be used. For example, the timer Tm0 may generate a mask signal for masking a switch signal for turning on any switch SW during the guard time T0. Furthermore, the timer Tm0 may generate a mask signal for masking a switch signal regardless of whether a switch SW is turned on/off.

A semiconductor memory according to a tenth embodiment will now be described.

Figure 20:
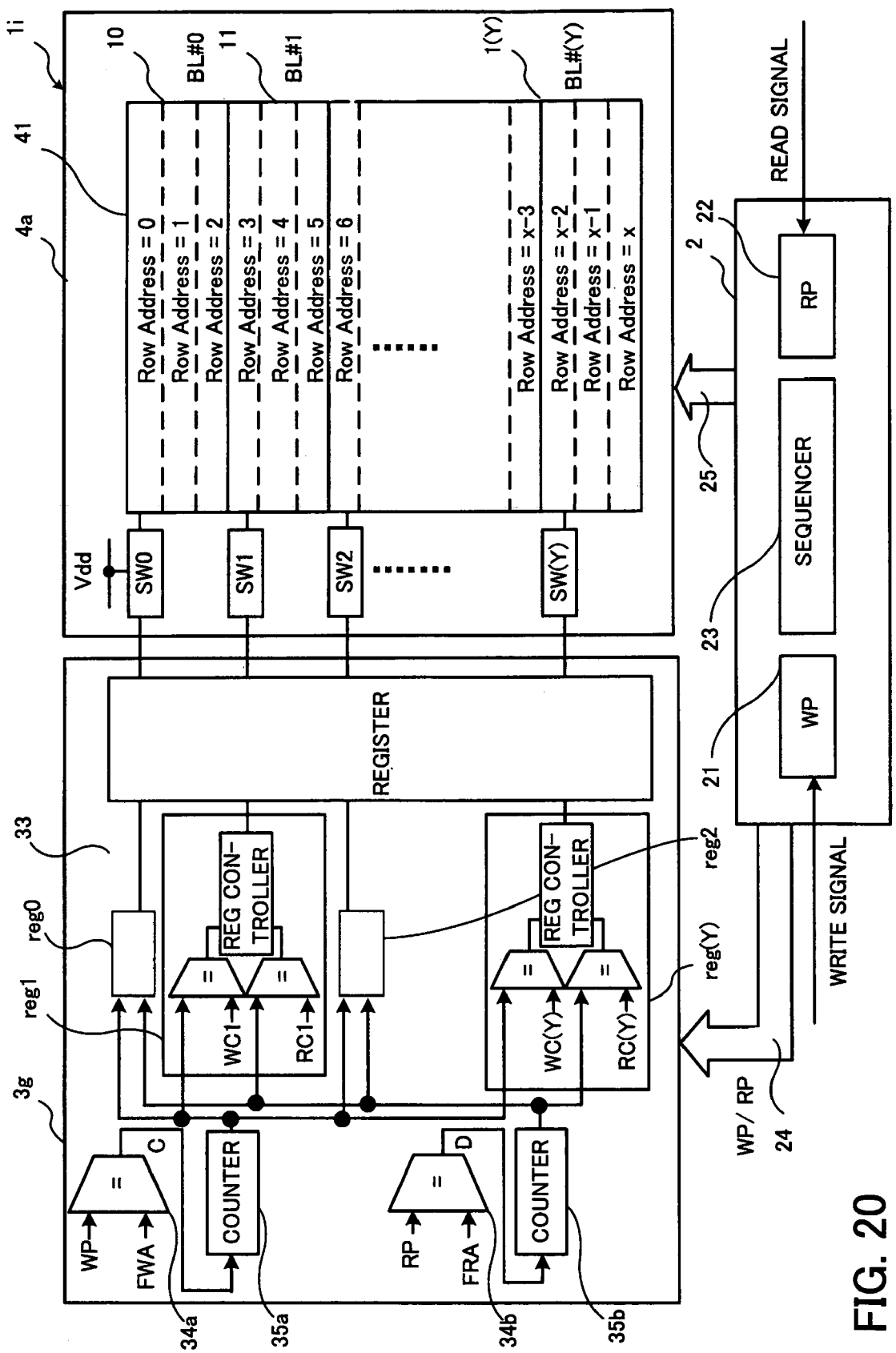
FIG. 20 is a block diagram showing a semiconductor memory according to a tenth embodiment.

FIG. 20 is a block diagram showing a semiconductor memory according to a tenth embodiment.

The differences between the above semiconductor memory 1c according to the fourth embodiment and a semiconductor memory 1i according to the tenth embodiment will now be described. Descriptions of the same matters will be omitted.

The semiconductor memory ii according to the tenth embodiment includes a switch signal output section 3g in which logic for determining whether the number of times a write address (WP) or a read address (RP) is accessed matches a number set in advance is added to on/off control of a switch SW corresponding to each block.

The switch signal output section 3g of the semiconductor memory 1i according to the tenth embodiment includes operation units 34a and 34b, counters 35a and 35b, and match determination/register control units reg0 through reg(Y).

When a WP matches a row address (herein after referred to as the "FWA") to which writing is performed first in a block according to sequence, the operation unit 34a outputs a signal.

When an RP matches a row address (herein after referred to as the "FRA") from which reading is performed last in a block according to sequence, the operation unit 34b outputs a signal.

The counters 35a and 35b are connected to the match determination/register control units reg0 through reg(Y).

The counter 35a counts the number of signals sent from the operation unit 34a and outputs the count to the match determination/register control units reg0 through reg(Y).

The counter 35b counts the number of signals sent from the operation unit 34b and outputs the count to the match determination/register control units reg0 through reg(Y).

The match determination/register control units reg0 through reg(Y) will now be described. Each of the match determination/register control units reg0 through reg(Y) has the same structure, so only the match determination/register control unit reg1 will be described.

Figure 21:
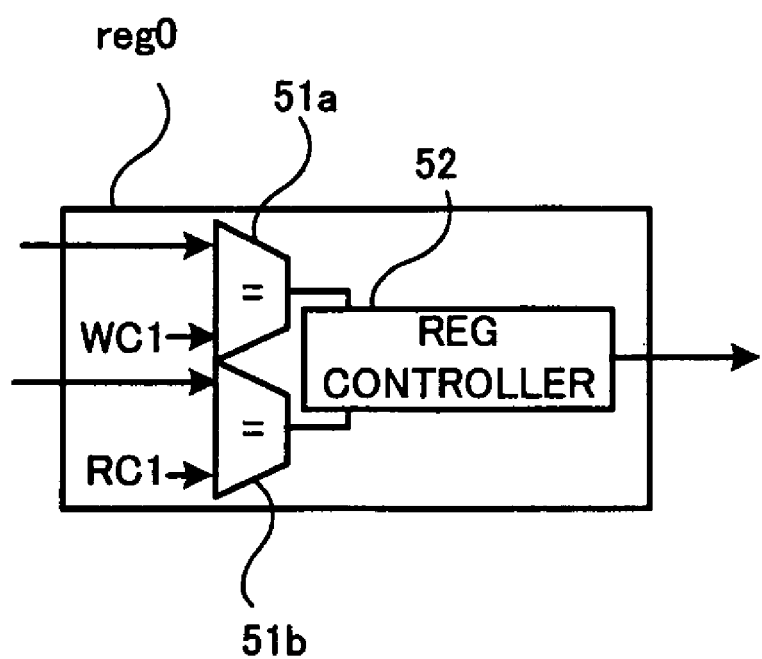
FIG. 21 is a block diagram showing a match determination/register control unit of the semiconductor memory according to the tenth embodiment.

FIG. 21 is a block diagram showing a match determination/register control unit of the semiconductor memory according to the tenth embodiment.

The match determination/register control unit reg1 includes operation units 51a and 51b and a Reg controller 52.

When the output from the counter 35a matches the count WC1, the operation unit 51a outputs a signal to the Reg controller 52. The Reg controller 52 outputs a switch signal P1 for turning on a switch SW1 in response to the output from the operation unit 51a.

When the output from the counter 35b matches the count RC1, the operation unit 51b outputs a signal to the Reg controller 52. The Reg controller 52 outputs a switch signal P1 for turning off the switch SW1 in response to the output from the operation unit 51b.

An example of the operation of the semiconductor memory 1i according to the tenth embodiment will now be described.

Figure 22:
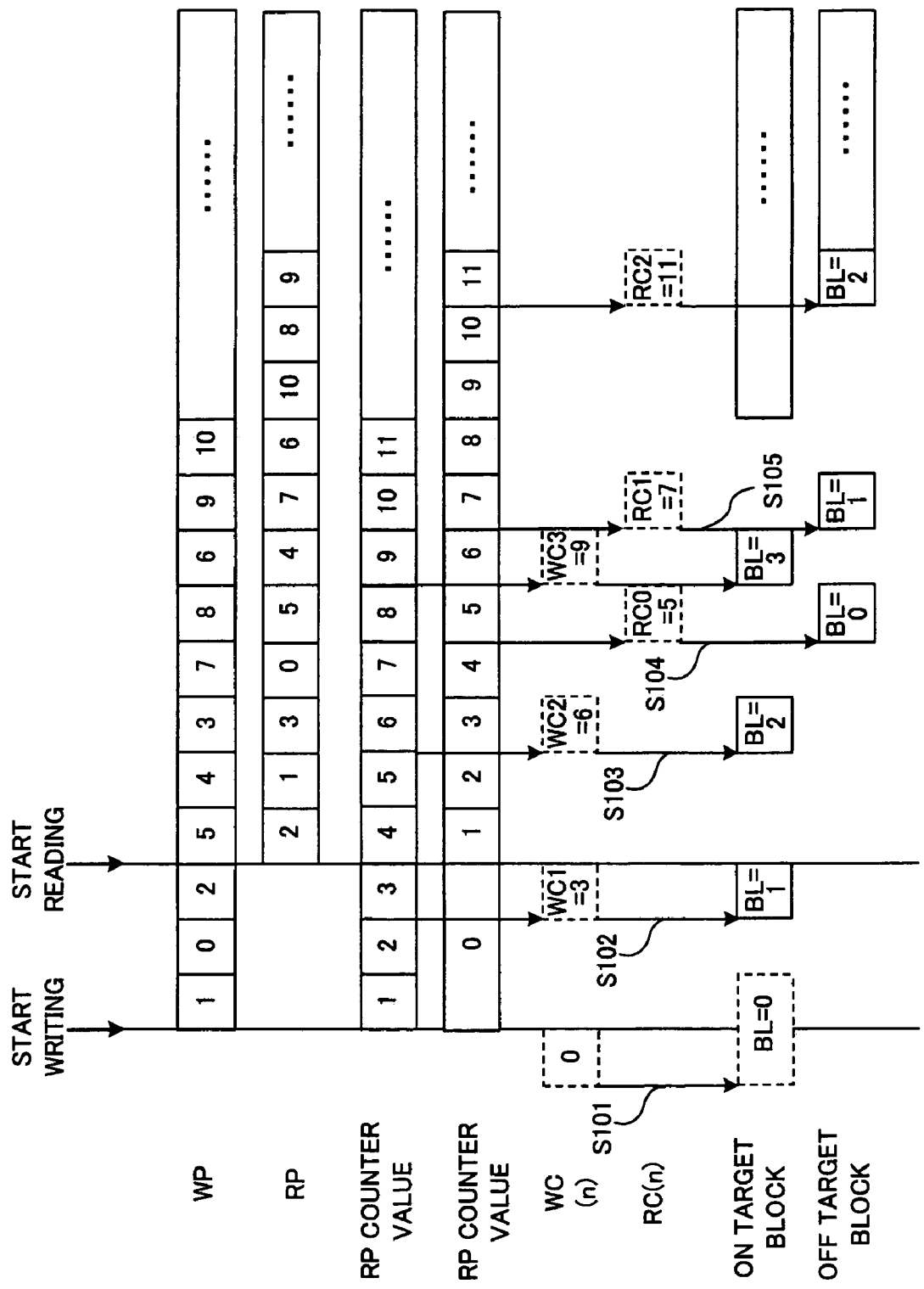
FIG. 22 is a timing chart showing an example of the operation of the semiconductor memory according to the tenth embodiment.

FIG. 22 is a timing chart showing an example of the operation of the semiconductor memory according to the tenth embodiment.

In the following descriptions it is assumed that FWA=1, FRA=2, WC0=0, WC1=3, WC2=6, WC3=9, RC0=5, RC1=7, and RC2=11.

In FIG. 21, a "WP counter value" indicates the value of the counter 35a and an "RP counter value" indicates the value of the counter 35b.

Before writing operation is begun, a switch SW0 is turned on first (step S101).

After that, the writing operation is begun. WP=1 is inputted to the operation unit 34a and this value matches FWA=1. After that, the value of the counter 35a is incremented each time a WP is inputted. When a third WP is inputted to the operation unit 34a, the value of the counter 35a becomes three. This value matches WC1. Accordingly, the match determination/register control unit reg1 outputs the switch signal P1 for turning on the switch SW1 (step S102).

When a sixth WP is inputted to the operation unit 34a, the value of the counter 35a becomes six. This value matches WC2. Accordingly, the match determination/register control unit reg2 outputs a switch signal P2 for turning on a switch SW2 (step S103).

Reading operation is also begun. RP=2 is inputted to the operation unit 34b and this value matches FRA=2. After that, the value of the counter 35b is incremented each time an RP is inputted. When a fifth RP is inputted to the operation unit 34b, the value of the counter 35b becomes five. This value matches RC0. Accordingly, the match determination/register control unit reg0 outputs a switch signal for turning off a switch SW0 (step S104).

When a seventh RP is inputted to the operation unit 34b, the value of the counter 35b becomes seven. This value matches RC1. Accordingly, the match determination/register control unit reg1 outputs the switch signal P1 for turning off the switch SW1 (step S105).

After that, the operation is performed in the same way.

With the semiconductor memory 1i according to the tenth embodiment, the same effect that is obtained by the semiconductor memory 1c according to the fourth embodiment can be achieved.

In addition, instead of controlling power to each block on the basis of a row address designated by a WP or an RP, the semiconductor memory 1i according to the tenth embodiment controls power to each block on the basis of the number of times access is performed. As a result, determination logic can be simplified.

The semiconductor memory can be applied to electronic devices such as personal digital assistants and portable telephones (including personal handyphone systems (PHS)). In particular W-CDMA type portable telephones require complicated control. As a result, continuous talking time and continuous waiting time become short. Accumulation of slight reductions in power consumption enables long wait time. Accordingly, the method for reducing power consumption should be applied to portable telephones in order to lengthen continuous telephone conversation time and continuous wait time. This is one of the features.

The preferred embodiments have been described in detail. However, the present invention is not limited to these specific embodiments.

In addition, any two or more of the structures (features) of the above embodiments may be combined properly.

With the semiconductor memory according to each of the above embodiments a WP and an RP are generated by the WP generation unit 21 and the RP generation unit 22, respectively, of the address control section 2. However, another method may be used. For example, the semiconductor memory may accept fixed sequence from the outside. In this case, a WP and an RP obtained may be held in a register included in the address control section 2.

In the above initial state a predetermined number of switches SW from the switch SW0 (switch SW0, in each of the above embodiments) is turned on in advance by the operation start signal sent from the address control section. However, another method may be used. A WP which designates a row address accessed first is known. Therefore, a predetermined number of switches SW from a switch SW at the first stage (switch SW0, in each of the above embodiments), for example, may always be energized at idle time.

In the present invention sequence from the beginning of writing to the end of reading is controlled. By doing so, on/off control can be exercised over power to each word line of the memory cell array without a microprocessor.

In addition, power to a memory cell to which data is not written or from which data is not read out can be turned off easily and reliably. Accordingly, a leakage current in a memory cell array can be decreased.

As a result, the power consumption of the memory cell array can be reduced.

The number of each embodiment has nothing to do with the importance of the invention.

The foregoing is considered as illustrative only of the principles. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory for exercising sequence control, the memory comprising:

a memory cell array;

a plurality of power on/off sections turning on/off power corresponding to addresses of the memory cell array;

an address control section exercising sequence control over the memory cell array on the basis of a write pointer generated at the time of a write signal being inputted for designating an address to which data of a predetermined data stream is to be written and a read pointer generated at the time of a read signal being inputted for designating an address from which the data is to be read out; and an on/off signal generation section generating on/off signals controlling power on/off sections on the basis of the write pointer and the read pointer.

2. The semiconductor memory according to claim 1, further comprising:

a write pointer generation section generating the write pointer; and a read pointer generation section generating the read pointer.

3. The semiconductor memory according to claim 1, wherein the address control section exercises FIFO control.

4. The semiconductor memory according to claim 1, wherein the on/off signal generation section generates the on/off signals turning on in order power corresponding to an address that comes a predetermined value after the address designated by the write pointer and turning off in order power corresponding to an address that comes a predetermined value before the address designated by the read pointer.

5. The semiconductor memory according to claim 1, wherein:
the memory cell array has a plurality of blocks each including a predetermined number of addresses; and
the plurality of power on/off sections correspond to the plurality of blocks.

6. The semiconductor memory according to claim 5, wherein each of the plurality of power on/off sections turns on/off a predetermined number of adjacent blocks at the same time.

7. The semiconductor memory according to claim 1, wherein a predetermined number of power on/off sections are controlled at the same time by the on/off signals.

8. The semiconductor memory according to claim 5, further comprising a signal mask section masking the on/off signals for predetermined time,
wherein:
the signal mask section includes a counter counting a number of times an address that comes a predetermined value before an address in a predetermined block to which writing is performed first is accessed; and
when a value of the counter matches a number set in advance, a mask is released.

9. The semiconductor memory according to claim 5, further comprising a signal mask section masking the on/off signals for predetermined time,
wherein:
the signal mask section includes a counter counting a number of times an address that comes a predetermined value before an address in a predetermined block to which writing is performed first is accessed and a timer; and
when the on/off signals are inputted and a value of the counter matches a number set in advance, the timer determines whether predetermined time elapsed, and releases a mask after the elapse of the predetermined time.

10. The semiconductor memory according to claim 1, further comprising a write pointer counter counting a number of times access is performed in order to write to a predetermined range of addresses and a read pointer counter counting a number of times access is performed in order to read from a predetermined range of addresses,
wherein:
when a value of the write pointer counter matches a predetermined value, power corresponding to a predetermined address is turned on; and
when a value of the read pointer counter matches a predetermined value, power corresponding to a predetermined address is turned off.

11. The semiconductor memory according to claim 1, wherein power is supplied in advance to an address at which the address control section accesses first on the basis of the write pointer.

12. The semiconductor memory according to claim 1, wherein when the address control section is started, the address control section and a power on/off section turning on/off power corresponding to an address at which the address control section accesses first are started at the same timing.

13. A semiconductor memory exercising sequence control, the memory comprising:
a memory cell array;
a plurality of power on/off sections turning on/off power corresponding to addresses of the memory cell array;
an address control section generating an offset write pointer which designates an address that comes a predetermined offset value before an address which is designated by a write pointer and to which data of a predetermined data stream is to be written at the time of a write signal being inputted, generating an offset read pointer which designates an address that comes a predetermined offset value after an address which is designated by a read pointer and from which the data is to be read out at the time of a read signal being inputted, and exercising the sequence control on the basis of the offset write pointer and the offset read pointer; and
an on/off signal generation section generating on/off signals controlling power on/off sections on the basis of the offset write pointer and the offset read pointer.

14. The semiconductor memory according to claim 13, further comprising:
an offset write pointer generation section generating the offset write pointer; and
an offset read pointer generation section generating the offset read pointer.

15. An electronic device exercising sequence control, the device comprising:
a memory cell array;
a plurality of power on/off sections turning on/off power corresponding to addresses of the memory cell array;
an address control section exercising the sequence control on the basis of a write pointer generated at the time of a write signal being inputted for designating an address to which data of a predetermined data stream is to be written and a read pointer generated at the time of a read signal being inputted for designating an address from which the data is to be read out;
a write pointer generation section generating the write pointer;
a read pointer generation section generating the read pointer; and
an on/off signal generation section generating on/off signals controlling power on/off sections on the basis of the write pointer and the read pointer.

16. A portable electronic device exercising sequence control, the device comprising:
a memory cell array;
a plurality of power on/off sections turning on/off power corresponding to addresses of the memory cell array;
an address control section generating an offset write pointer which designates an address that comes a predetermined offset value before an address which is designated by a write pointer and to which data of a predetermined data stream is to be written at the time of a write signal being inputted, generating an offset read pointer which designates an address that comes a predetermined offset value after an address which is designated by a read pointer and from which the data is to be read out at the time of a read signal being inputted, and exercising the sequence control on the basis of the offset write pointer and the offset read pointer;
a write pointer generation section generating the write pointer;

an offset write pointer generation section generating the offset write pointer;

a read pointer generation section generating the read pointer;

an offset read pointer generation section generating the offset read pointer; and an on/off signal generation section generating on/off signals controlling power on/off sections on the basis of the offset write pointer and the offset read pointer.

* * * * *